(12) United States Patent
Miyamoto

(10) Patent No.: US 7,023,275 B2
(45) Date of Patent: Apr. 4, 2006

(54) VARIABLE GAIN AMPLIFIER

(75) Inventor: Masayuki Miyamoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 399 days.

(21) Appl. No.: 10/084,184

(22) Filed: Feb. 28, 2002

(65) Prior Publication Data

US 2002/0118065 A1    Aug. 29, 2002

(30) Foreign Application Priority Data

Feb. 28, 2001  (JP)  ............................. 2001-055482
Feb. 6, 2002   (JP)  ............................. 2002-029742

(51) Int. Cl.
     *H03F 3/45*  (2006.01)
(52) U.S. Cl. ...................... 330/254; 330/278
(58) Field of Classification Search ............... 330/134, 330/254, 295, 124 R, 84, 278; 327/359
     See application file for complete search history.

(56) References Cited

U.S. PATENT DOCUMENTS

| | | | | |
|---|---|---|---|---|
| 4,795,916 A | * | 1/1989 | Liron | ........................... 307/270 |
| 5,619,169 A | * | 4/1997 | Matsuura | .................... 330/254 |
| 5,945,697 A | * | 8/1999 | Kuno et al. | ................. 257/239 |
| 6,021,071 A | * | 2/2000 | Otsuka | .................. 365/189.05 |
| 6,049,252 A | * | 4/2000 | Iwata | ........................... 330/254 |
| 6,100,761 A | | 8/2000 | Ezell | |
| 6,201,443 B1 | * | 3/2001 | Tanji | ........................... 330/254 |
| 6,218,899 B1 | * | 4/2001 | Ezell | ........................... 330/254 |
| 6,472,936 B1 | * | 10/2002 | Jones | ........................... 330/51 |

FOREIGN PATENT DOCUMENTS

JP  2003-46352  *  2/2003

OTHER PUBLICATIONS

Soorapanth, Theerachet "RF Linearity of SHort-Channel MOSFERs" First International Workshop on Design of Mixed-Mode Integrated Circuits and Applications, Jul. 1997, pp. 81-84.

* cited by examiner

*Primary Examiner*—Henry Choe
(74) *Attorney, Agent, or Firm*—Birch, Stewart, Kolasch & Birch, LLP

(57) ABSTRACT

A variable gain amplifier includes a current path control circuit which controls a path of a current flow through an amplifying transistor section, so as to control the actual size of transistors which make up the amplifying transistor section, and thereby control the gain and IIP3 (third-order Input Intercept Point). When the size W/L of the transistors is decreased or increased under constant current level maintained in a current path control circuit in the circuit, the transconductance (gain) is decreased or increased and the IIP3 is increased or decreased. According to this principle, there is provided a variable gain amplifier with a small mount area, capable of compensating for a decrease of the gain by an increase of the IIP3.

54 Claims, 25 Drawing Sheets

VARIABLE GAIN AMPLIFIER

FIELD OF THE INVENTION

The present invention relates to highly linear variable gain amplifiers having semi conductor element components, and particularly to variable gain amplifiers which are effective in realizing broadband wireless communication devices.

BACKGROUND OF THE INVENTION

Broadband wireless communication devices such as a tuner used in television broadcasts via cable transmission or wireless transmission require a variable gain amplifier with high linearity (small distortion) to suppress intermodulation interference between different channels in response to input of a strong signal. Conventional tuners made up of discrete parts have adopted an attenuator with highly linear PIN diode components to prevent entry of a strong signal into the amplifier and thus suppress an intermodulation interference signal. However, the PIN diodes cannot be formed on a common semiconductor integrated circuit such as a CMOS or bipolar semiconductor integrated circuit. Thus, in order to realize a wireless communication device on a semiconductor integrated circuit, a different type of variable gain amplifier is needed.

An example of such a variable gain amplifier is disclosed in U.S. Pat. No. 6,100,761 (Highly Linear Variable-Gain Low Noise Amplifier; issued Aug. 8, 2000). This amplifier, as shown in FIG. 23, is provided with an NPN transconductance pair which includes transistors IQ1 and IQ2. To the collector of the transistors IQ1 and IQ2 is applied a power voltage Vc via a variable resistor 1Rc, and the emitter is connected to a GND line via a variable resistor 1Re. The transistors IQ1 and IQ2 have IN+ and IN− at their bases, respectively, and receive a bias voltage vb via resistors 1Rb1 and 1Rb2, respectively.

The gain of the amplifier is given by 1Rc/(1/gm+1Re), where gm is the transconductance of the transistors IQ1 and IQ2. This amplifier realizes variable gain control by the circuit structure, as shown in FIG. 24, in which the variable resistor 1Re is configured with a resistor ladder of resistors Rn1, Rn2, Rn3, . . . , and so on, and nMOS switches Mn1, Mn2, Mn3, . . . , and so on, which are connected between the resistors. The nMOS switches Mn1, Mn2, Mn3, . . . , and so on are switched open or closed by the respective voltages Vn1, Vn2, Vn3, and so on received at the gates.

However, the foregoing amplifier has the following three problems.

Firstly, accurate designing of the resistor ladder requires a low ON resistance for the nMOS transistors switches Mn1, Mn2, Mn3, . . . , and so on. However, in order to fabricate a switch with an ON resistance of 1 Ω using, for example, a standard CMOS process of 0.25 μm, a gigantic transistor with a channel width of 1000 μm will be required. The resistor ladder requires a plurality of such gigantic transistors. The result of this is an increased mount area.

Secondly, a change in resistance value of the variable resistor 1Re varies the value of the current in the circuit, which causes the operating point of the transistors to fluctuate. This fluctuation of the operating point is suppressed by the provision of an adjuster circuit of a bias voltage Vb, as shown in FIG. 25. In the adjuster circuit shown in FIG. 25, a resistor 5Rb is connected between the collector and base of a transistor 5Q1, and a variable resistor 5Re is provided between the emitter of the transistor 5Q1 and a GND line.

Further, a bias current 51c is flown into the junction of the resistance 5Rb and the collector, and a voltage 5Vb at the collector is outputted as a bias voltage Vb via a buffer amplifier 501. However, because this adjuster circuit includes the resistor 5Rb, which is a replica of the resistor ladder, the mount area is again increased.

Thirdly, disregarding the bipolar transistors used in FIG. 23 and FIG. 25, the following considers a circuit which incorporates a MOS transistor, instead of the bipolar transistor, which can be provided by the CMOS process, which is less expensive than the BiCMOS process. Current I through the MOS transistor is given by $$I = K \cdot (W/L) \cdot Vod^2 \qquad (1).$$

Here, K is a process-dependent constant, W is the channel width of the transistor, and L is the channel length of the transistor. Further, Vod=Vgs−Vth, and Vgs=Vg−Vs, where Vg is the gate voltage, Vs the source voltage, and Vth the threshold voltage of the transistor. According to this arrangement, voltage Vod does not change even when the resistance value of the variable resistor 1Re is varied to reduce gain, because the adjuster circuit of a bias voltage Vb operates to flow a constant current.

Incidentally, *RF Linearity of Short-Channel MOSFETs*, Theerachet Soorapanth and Thomas H. Lee, First International Workshop on Design of Mixed-Mode Integrated Circuits and Applications, Cancun, Mexico, Jul. 28–30, 1997, pp. 81–84 teaches the concept of IIP3 (third-order Input Intercept Point), which is an index of third-order distortion component of the circuit, and is an input value at which the third-order intermodulation component in response to a two-tone input takes the value of the first-order component. FIG. 5 of this publication indicates that the IIP3 of the MOS transistor is determined by the value of Vod. Therefore, the IIP3 will not change even when the gain of the amplifier is changed by varying the resistance value of the variable resistor 1Re.

SUMMARY OF THE INVENTION

It is an object of the present invention to provide variable gain amplifiers with a small mount area, which are operable to compensate for a decrease of a gain by an increase of an IIP3.

In order to achieve this object, a variable gain amplifier of the present invention includes: an amplifying transistor which amplifies an input signal; and a current path control section which controls a size of the amplifying transistor and a path of a current through the amplifying transistor.

According to this arrangement, when the size (W/L) of the amplifying transistor is decreased or increased under constant current maintained by the current path control section, the IIP3, which is an index of linearity, is increased or decreased, and the gain is decreased or increased. This solves the problem of the variable gain amplifier of a CMOS structure, in which a decrease of the gain is not accompanied by an increase of the IIP3. Further, the resistor ladder, which was conventionally required to vary gain, will not be required. Accordingly, there will not be required a large switch used to lower ON resistance of the switch in the resistor ladder. As a result, it is possible to provide variable gain amplifiers with a small mount area, capable of compensating for a decrease of the gain by an increase of the IIP3.

A variable gain amplifier underlying the present invention preferably has an arrangement in which the current path control section includes a current control transistor which controls a current flow through the amplifying transistor, and includes: a plurality of unit circuits which are disposed parallel to one another, each having the amplifying transistor and the current control transistor, the unit circuits being connected to one another through signal inputs and signal outputs of the unit circuits.

With this arrangement, by the control of the current control transistor, the current flow through the amplifying transistor can be independently controlled. For example, a current flow into the amplifying transistor of one of the unit circuits can be cut off to disable the amplifying transistor of this unit circuit, so that the amplifying transistor does not contribute to amplification of the input signal. This enables a size of the amplifying transistor to be controlled per unit circuit.

For a fuller understanding of the nature and advantages of the invention, reference should be made to the ensuing detailed description taken in conjunction with the accompanying drawings.

DESCRIPTION OF THE EMBODIMENTS

The following will describe embodiments of the present invention with reference to FIG. 1 through FIG. 22, and FIG. 26.

First, the underlying principle of a variable gain amplifier according to the present embodiment will be explained.

Figure 1:
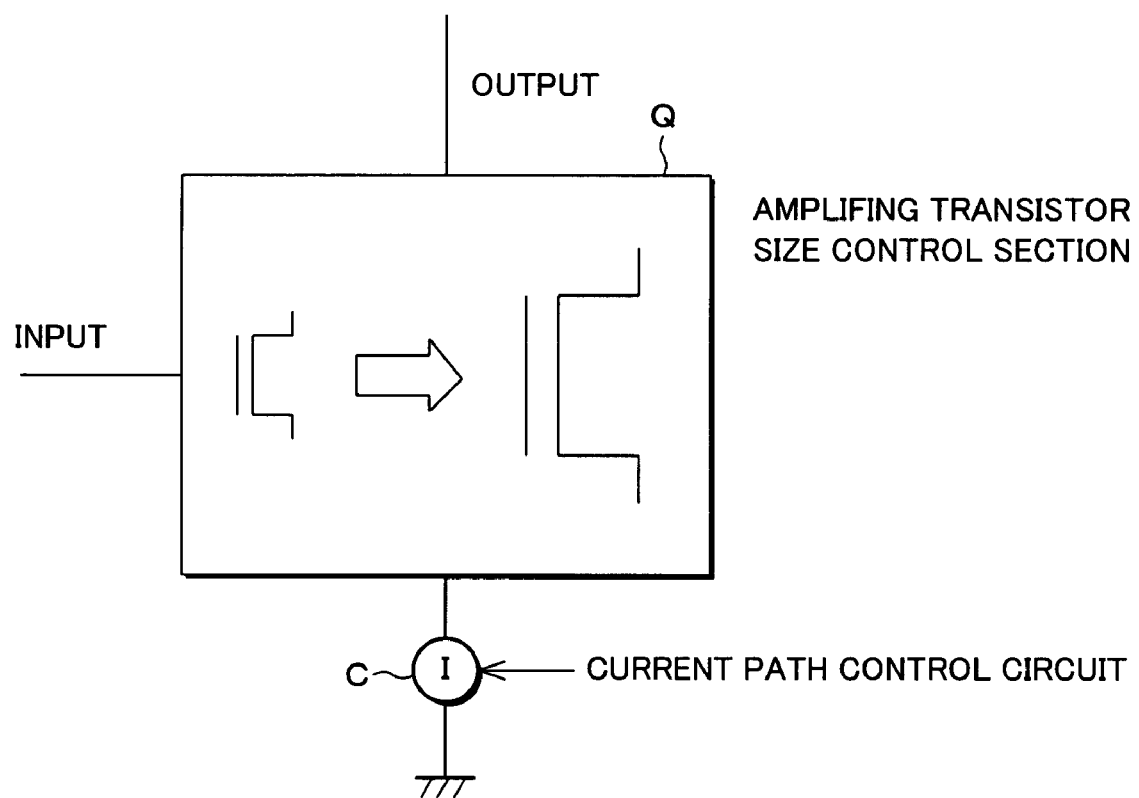
FIG. 1 is a block diagram showing a basic configuration of variable gain amplifiers according to embodiments of the present invention.

As shown in FIG. 1, the variable gain amplifier includes an amplifying transistor section Q and a current path control circuit C. The current path control circuit C (current path control section) controls a path of the current which flows through the amplifying transistor section Q, so as to control a size of transistors making up the amplifying transistor section Q, an IIP3, and a gain.

From Equation (1), voltage Vod which determines the IIP3 of the MOS transistor can be given by $$Vod = \{I/(K \cdot W/L)\}^{1/2} \qquad (2).$$

The transconductance gm which determines the gain of the MOS transistor can be determined by differentiating Equation (1) as follows $$gm = 2 \cdot K \cdot (W/L) \cdot Vod = 2 \cdot \{I \cdot K \cdot W/L\}^{1/2} \qquad (3).$$

It can be seen from Equation (2) and Equation (3) that the voltage Vod or IIP3 is increased or decreased, and the transconductance gm or gain is decreased or increased, when the size W/L of the transistor is decreased or increased by the current control circuit C under current I held at a constant value. The variable gain amplifier of the present invention utilizes this phenomenon to increase or decrease the IIP3, or decrease or increase the gain, by making size W/L of the transistor smaller or larger under constant current I flowing through the amplifying transistor.

Now, specific configurations of the variable gain amplifier will be described below in accordance with the embodiments of the present invention. Note that, those constituting elements which are common throughout the embodiments are indicated by the same reference numerals.

[First Embodiment]

Figure 2:
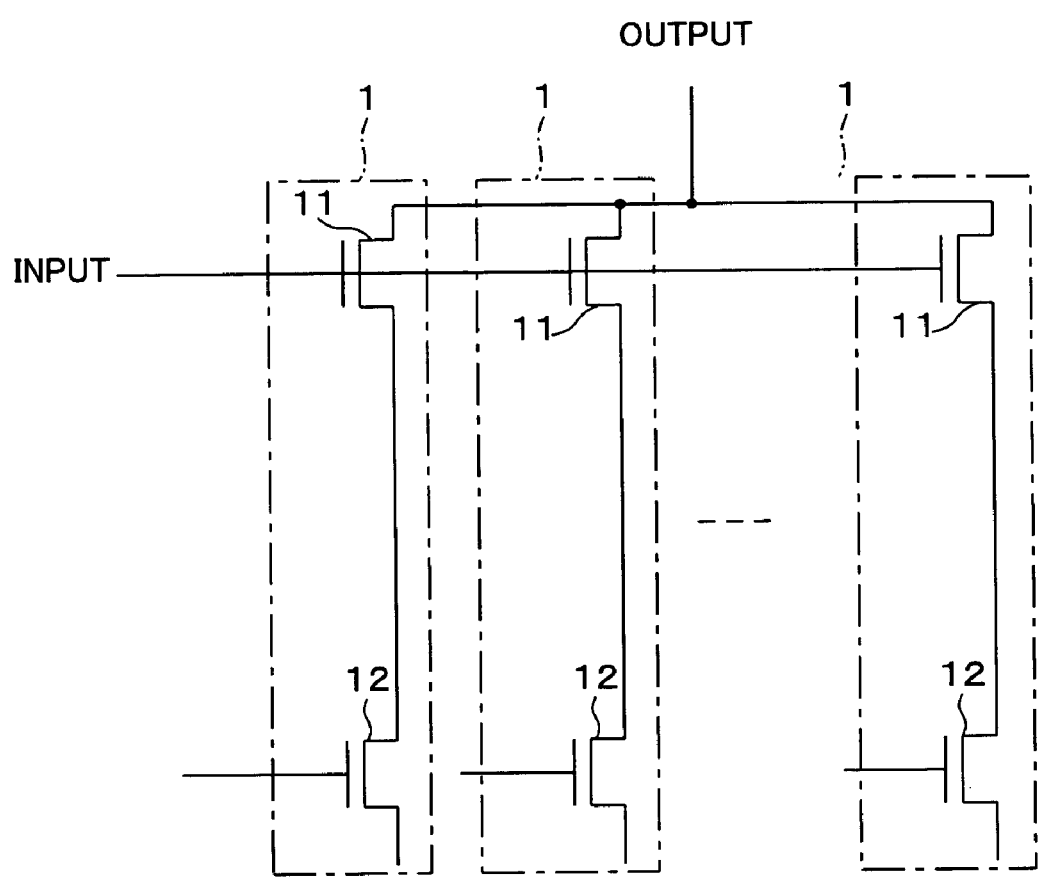
FIG. 2 is a circuit diagram showing a configuration of a variable gain amplifier according to the First Embodiment of the present invention.

A variable gain amplifier according to this embodiment, as shown in FIG. 2, includes a plurality of unit circuits 1, each having a signal input transistor 11 (amplifying transistor) and a current control transistor 12. In the unit circuit 1, the source of the signal input transistor 11 is connected to the drain of the current control transistor 12, and the signal from the drain of the signal input transistor 11 becomes the output of the circuit. The plurality of unit circuits 1 are disposed in parallel, and are connected to one another through the inputs (gate of the signal input transistor 11) and outputs of a signal, so as to make up a variable transconductance (voltage current gain) circuit with a plurality of control inputs.

In the variable transconductance circuit having such a configuration, the current through each unit circuit 1 (signal input transistor 11) can be independently controlled by controlling the gate voltage of the current control transistor 12. More specifically, a current flow into the unit circuit 1 can be cut off by feeding a power voltage of one level (low potential power voltage), for example, a ground voltage in the case of the nMOS transistor, or a power voltage (high potential power voltage) in the case of the pMOS transistor, to the gate of the current control transistor 12. That is, the signal input transistor 11 of the unit circuit 1 does not contribute to the amplification of the input signal, which enables the actual size of the signal input transistor 11 to be controlled per unit circuit 1. Evidently, the size of the signal input transistors 11 may be different across the unit circuits 1, as will be described later.

In the foregoing configuration, the size W/L of the input signal transistors 11 can be controlled when the transistors of the unit circuits 1 have a common gate length L.

[Second Embodiment]

Figure 3A:
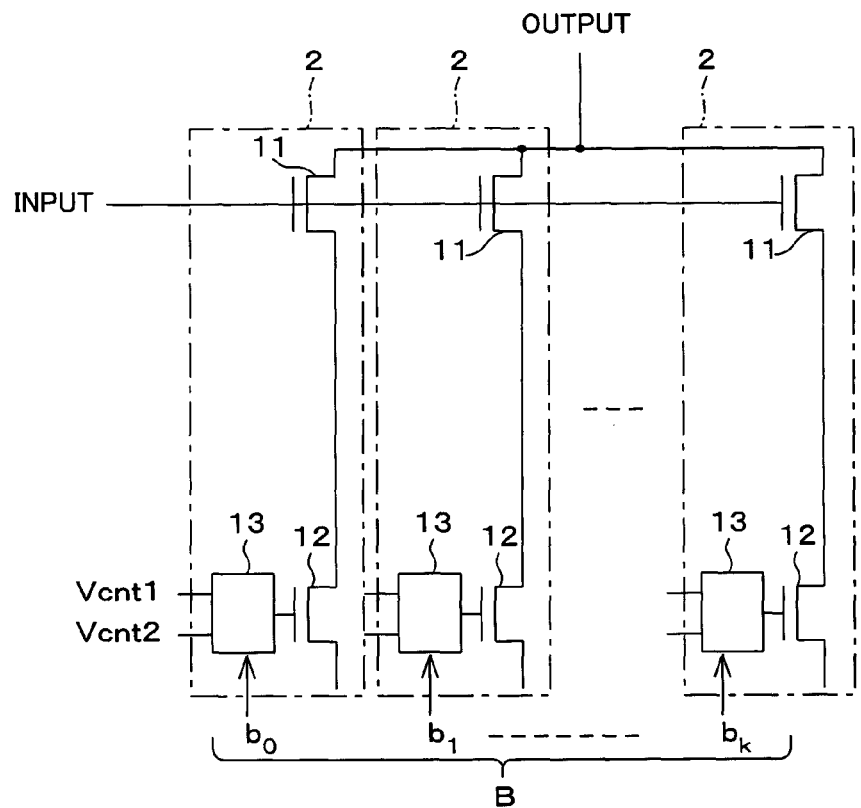
FIG. 3(a) is a circuit diagram showing a configuration of a variable gain amplifier according to the Second Embodiment of the present invention.

A variable gain amplifier according to this embodiment, as shown in FIG. 3(a), includes a plurality of unit circuits 2, each having a current control switch 13 in addition to the structure of the unit circuit 1 of the variable gain amplifier of FIG. 2. The current control switch 13 (switch control circuit) is operable to select a current control voltage Vcnt1 or Vcnt2 in accordance with a switch control signal B, so as to feed it as a gate voltage (operation control voltage) to the gate (input section) of the current control transistor 12. The switch control signal B is a digital signal of multiple bits b0, b1, . . . , bk (where k is an integer of not less than 0) which are respectively inputted to the unit circuits 2.

Under normal operating conditions, the switch control signal B is generated in accordance with the input signal or output signal, so that the signal level of the output becomes constant.

Note that, the configuration shown in FIG. 3(a) indicates the case where two current control voltages Vcnt1 and Vcnt2 are switched; however, three or more current control voltages may be used as well.

This logic control makes it possible to control (1) a size of the signal input transistors 11 which contribute to current amplification and (2) a current flow through the unit circuits 2, thereby enabling more accurate control. For example, when B=0, i.e., when b0, b1, . . . , bk are all 0, all the transistors become OFF to prevent output current flow. When any of b0, b1, bk is 1, the current control transistor 12 of the unit circuit 2 which receives this input comes into operation. Further, when b0, b1, . . . , bk are all 1, the current through the current control transistors 12 becomes maximum.

Figure 3B:
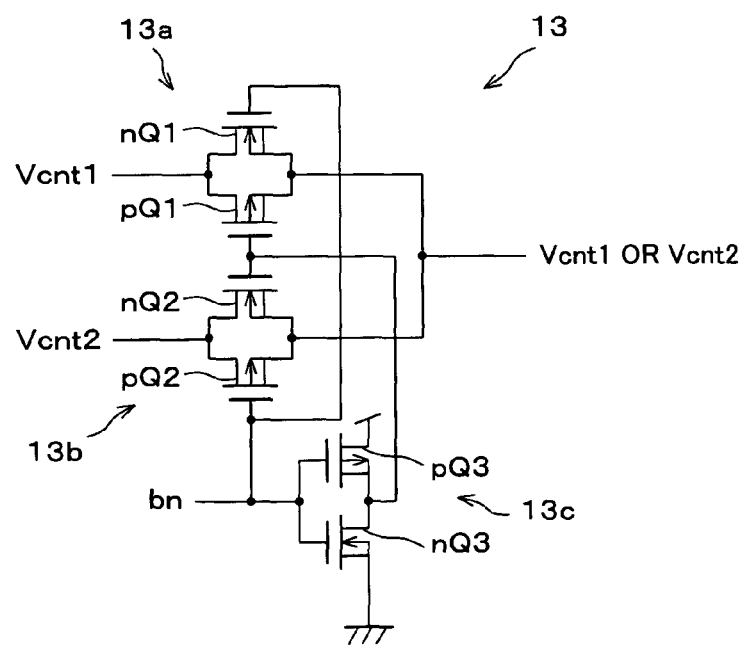
FIG. 3(b) is a circuit diagram showing a configuration of a current control switch in the variable gain amplifier of FIG. 3(a).

More specifically, the current control switch 13 includes, for example, as shown in FIG. 3(b), transfer gates 13a and 13b, and an inverter 13c. The transfer gate 13a has a pMOS transistor pQ1 and an nMOS transistor nQ1 which are connected to each other in parallel. The transfer gate 13b has a pMOS transistor pQ2 and an NMOS transistor nQ2 which are connected to each other in parallel. The inverter 13c has a pMOS transistor pQ3 and an nMOS transistor nQ3 which are connected to each other in series.

The bit bn (n=0, 1, . . . , k) of the switch control signal B is inputted to the gate of the pMOS transistors pQ2 and pQ3 and nMOS transistors nQ1 and nQ3. Further, the junction in the drain path of the pMOS transistor pQ3 and nMOS transistor nQ3 is connected to the gate of the pMOS transistor pQ1 and nMOS transistor nQ2.

In the current control switch 13 having the foregoing configuration, the value of bit bn is directly inputted to the gate of the nMOS transistor nQ1 and pMOS transistor pQ2, and to the gate of the pMOS transistor pQ1 and nMOS transistor nQ2 by being inverted through the inverter 13c. In response, either the transfer gate 13a or 13b opens according to the binary value of the bit bn to output the current control voltage Vcnt1 or Vcnt2.

In the configuration of FIG. 3(a), the current control voltages Vcnt1 and Vcnt2 may be set differently for each unit circuit 2 so that the size of the signal input transistors 11 and the current flow through the unit circuits 2 can be independently controlled for each unit circuit 2.

Figure 4:
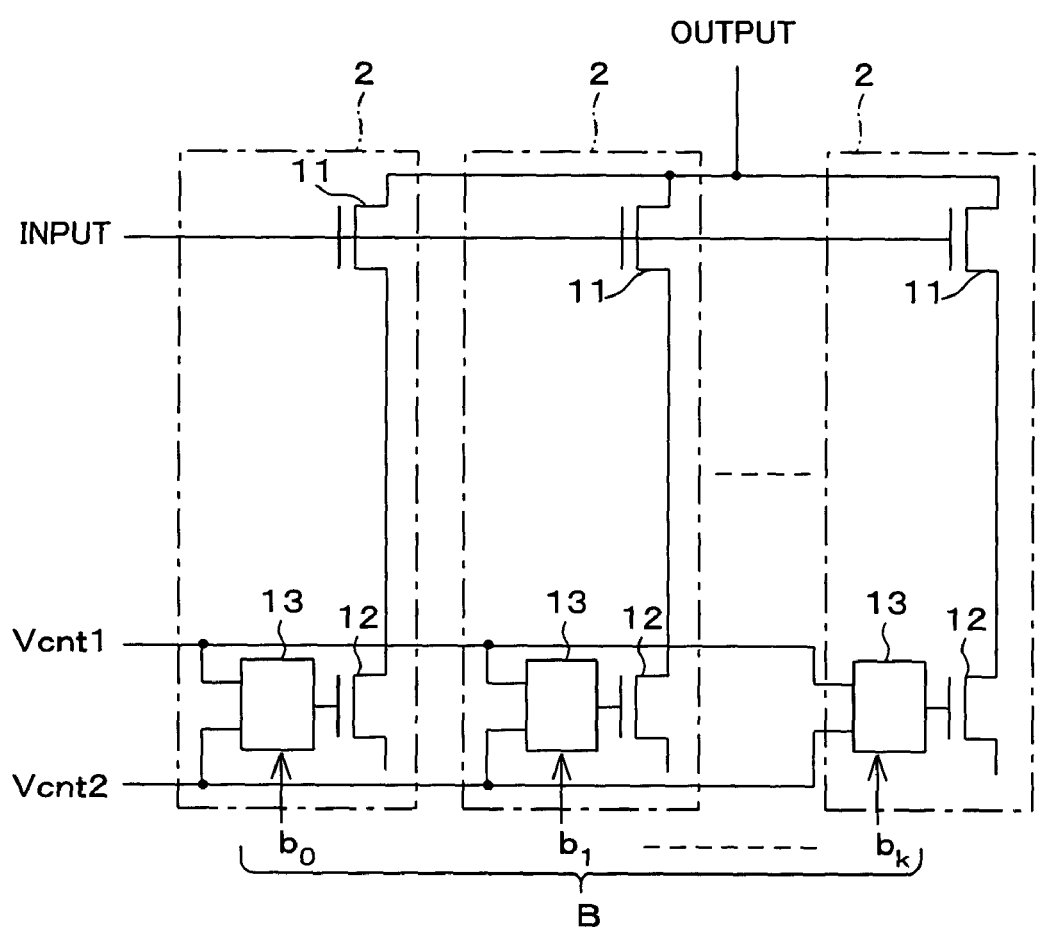
FIG. 4 is a circuit diagram showing a configuration of a variable gain amplifier according to a modification example of the Second Embodiment of the present invention.

Further, as shown in FIG. 4, common current control voltages Vcnt1 and Vcnt2 may be used for the unit circuits 2. In such a configuration, since only two current control voltages Vcnt1 and Vcnt2 are used, a less number of voltages are required. This makes it easier to control the current flow through the signal input transistors 11.

Figure 5:
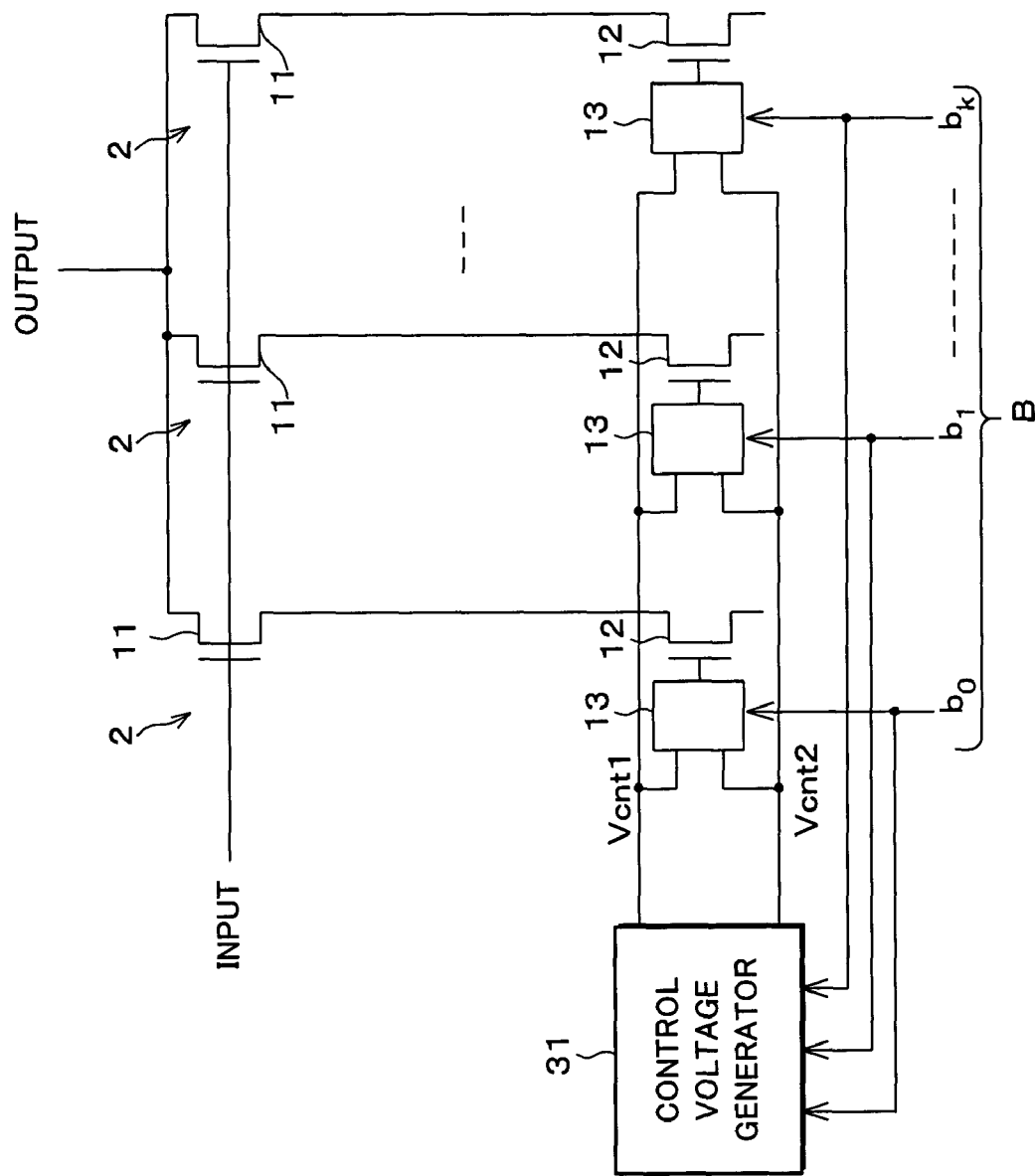
FIG. 5 is a circuit diagram showing a configuration of another variable gain amplifier according to the modification example of the Second Embodiment of the present invention.

For example, the configuration shown in FIG. 5 is provided with a control voltage generator 31 which varies the level of the current control voltages Vcnt1 and Vcnt2. The control voltage generator 31 controls the level of the current control voltages Vcnt1 and Vcnt2 in accordance with the value of bit bn of the switch control signal B. That is, the level of the current control voltages Vcnt1 and Vcnt2 is varied according to the value of bit bn, so as to vary a size of the signal input transistors 11 which contribute to amplification, and control a current flow through the signal input transistors 11.

Figure 6:
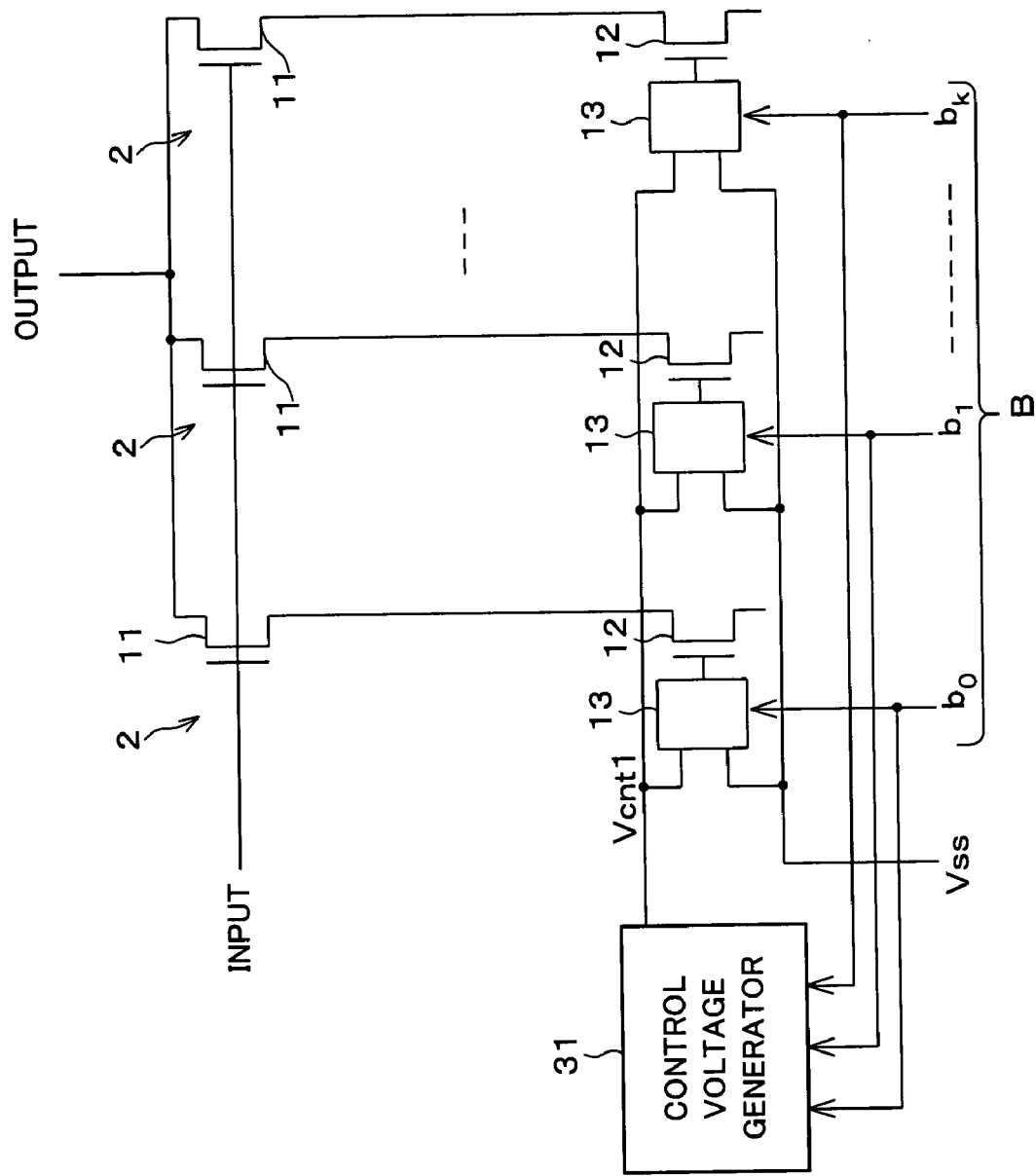
FIG. 6 is a circuit diagram showing a configuration of yet another variable gain amplifier of the modification example of the Second Embodiment of the present invention.

Further, in the configuration shown in FIG. 6, which is a modification of FIG. 5, the current control voltage Vcnt2 (or Vcnt1) is fixed at one level of power voltage Vss (low potential level, e.g., a ground voltage) which cuts the current flow into the signal input transistors 11.

In this configuration, the current flow through the signal input transistors 11 which became smaller in size by the absence of inflow current can be maintained at a constant level by controlling the current control voltage Vcnt1 (or Vcnt2) in such a manner that the difference from the power voltage Vss of the level to cut the current becomes greater. Further, the control voltage generator 31 is also operable to carry out the control of varying the current control voltage Vcnt1 (or Vcnt2) according to the number of unit circuits 2 which do not have a current supply, so as to maintain the total current flow through the other unit circuits 2 at a constant level.

Figure 7:
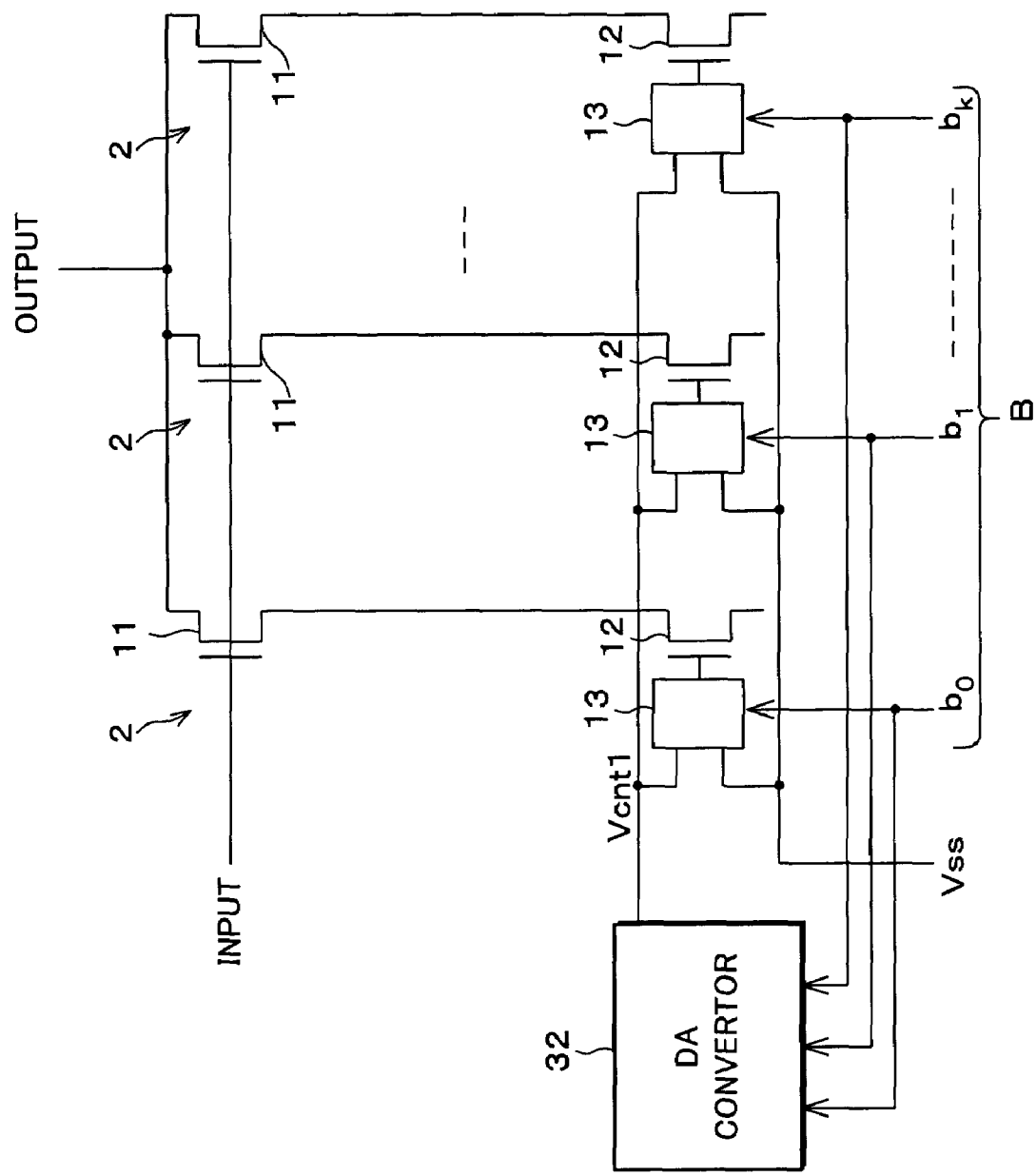
FIG. 7 is a circuit diagram showing a specific configuration of the variable gain amplifier of FIG. 6.

The configuration of FIG. 7, which is one concrete example of FIG. 6, is provided with a DA convertor 32 as the control voltage generator 31. The DA convertor 32 converts the input digital signal (switch control signal B) into an analog signal so as to generate the current control voltage Vcnt1.

[Third Embodiment]

Figure 8:
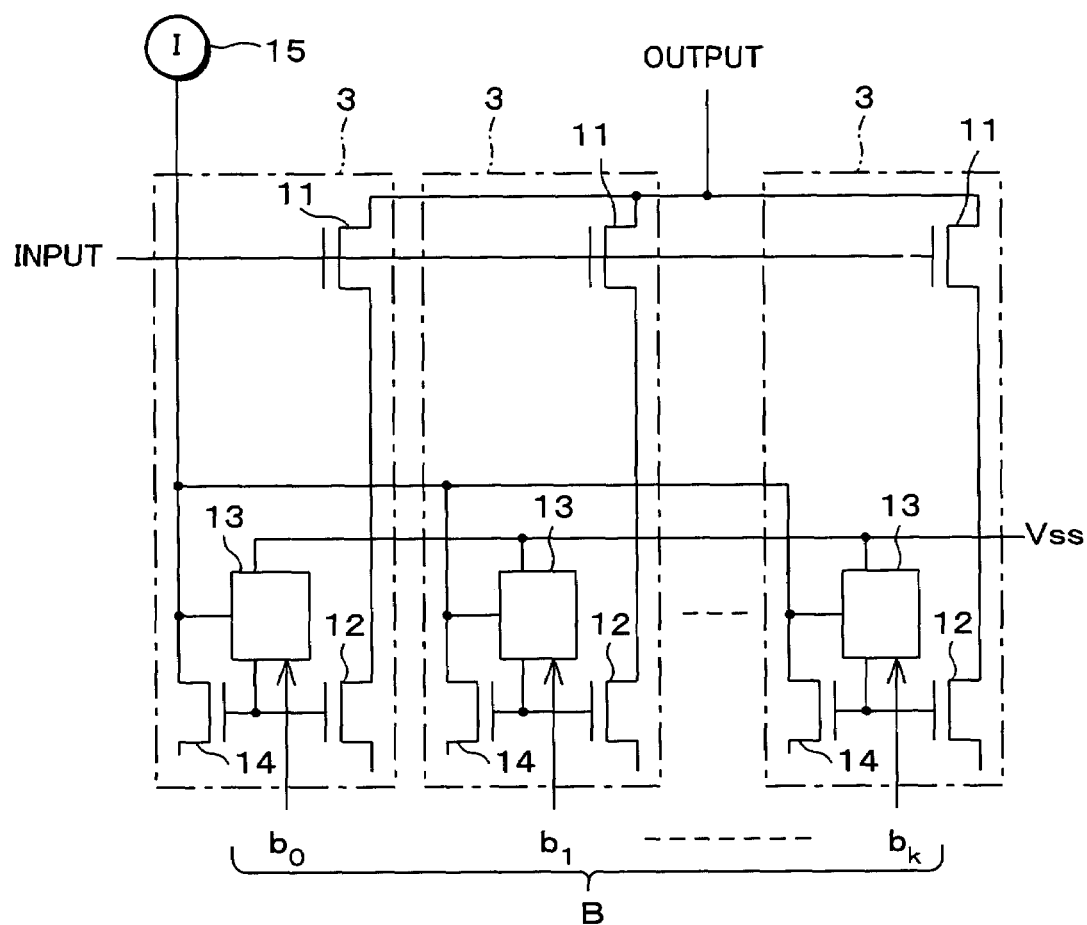
FIG. 8 is a circuit diagram showing a configuration of a variable gain amplifier according to the Third Embodiment of the present invention.

As shown in FIG. 8, a variable gain amplifier according to this embodiment is configured to realize the functions of the variable gain amplifiers of the FIG. 4 through FIG. 7 with a simple structure, using a MOS transistor. Specifically, the variable gain amplifier includes, instead of the unit circuits 2, a plurality of unit circuits 3, each having a current control transistor 14 (auxiliary current control transistor) and a current source 15, in addition to the configuration of the unit circuit 2.

The unit circuits 3, as with the unit circuits 2, are disposed in parallel, and are connected to one another through the signal inputs and signal outputs.

The source of the signal input transistor 11 is connected to the drain of the current control transistor 12, and the gate of the current control transistor 12 is connected to the gate of the current control transistor 14 and to the output terminal of the current control switch 13. One input terminal of the current control switch 13 is connected to the power voltage Vss, and the other input terminal of the current control switch 13 is connected to the drain of the current control transistor 14. Further, the drain of the current control transistor 14 of each unit circuit 3 is connected to the current source 15 which supplies a current of a constant current value I.

In the variable gain amplifier having the foregoing configuration, the current control transistors 12 and 14 in each unit circuit 3 make up a current mirror, and therefore the current control transistors 12 and 14 become ON/OFF all in the same manner, regardless of the digital input value of the switch control signal B (except for the case where all bits are 0). Thus, the current through the signal input transistor 11 is maintained at the current value I of the current source 15, regardless of the size of the signal input transistor 11. Accordingly, when the size of the signal input transistor 11 becomes smaller and a gain is reduced, the voltage Vod and IIP3 are increased.

Figure 9A:
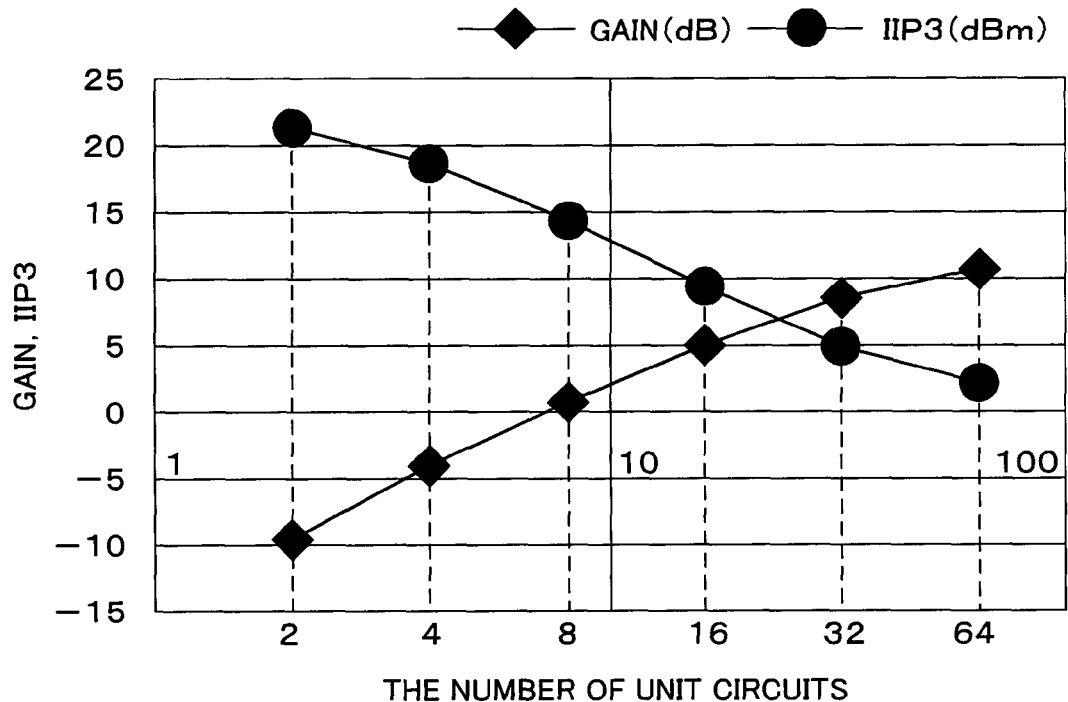
FIG. 9(a) is a graph showing how the number of unit circuits is related to gain and IIP3 in the variable gain amplifier of FIG. 8.
Figure 9B:
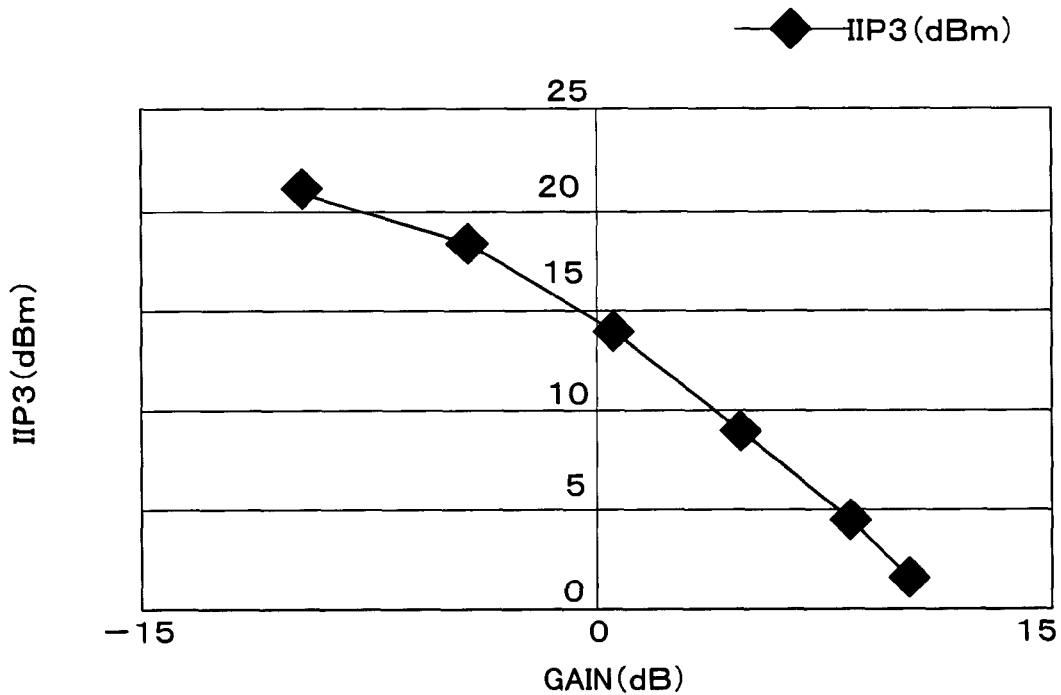
FIG. 9(b) is a graph showing how the gain and IIP3 are related to each other in the variable gain amplifier of FIG. 8.

FIG. 9(a) and FIG. 9(b) show a result of simulation of this behavior. This simulation used 64 unit circuits 3 which were connected in parallel and had the signal input transistors 11, current control transistors 12, and current control transistors 14, all of the size W=10 μm and L=0.24 μm.

FIG. 9(a) is a graph which shows how the gain and IIP3 change when the number of unit circuits 3 (size of transistors) which contribute to amplification is increased from 2, 4, 8, 16, 32, to 64, where the number of unit circuits 3 is represented in a Log scale on the horizontal axis. It can be seen from the graph that the gain increases and the IIP3 decreases as the number of unit circuits 3 is increased. FIG. 9(b) is a plot of IIP3 and gain, where IIP3 and gain are represented by the vertical axis and horizontal axis, respectively. It can be seen from the graph of FIG. 9(b) that the IIP3 increases as the gain decreases.

Note that, the graph of FIG. 9(a) indicates that the gain characteristics and IIP3 characteristics change almost linearly when the size of the transistors which contribute to amplification is increased by a factor of power.

[Fourth Embodiment]

Figure 10:
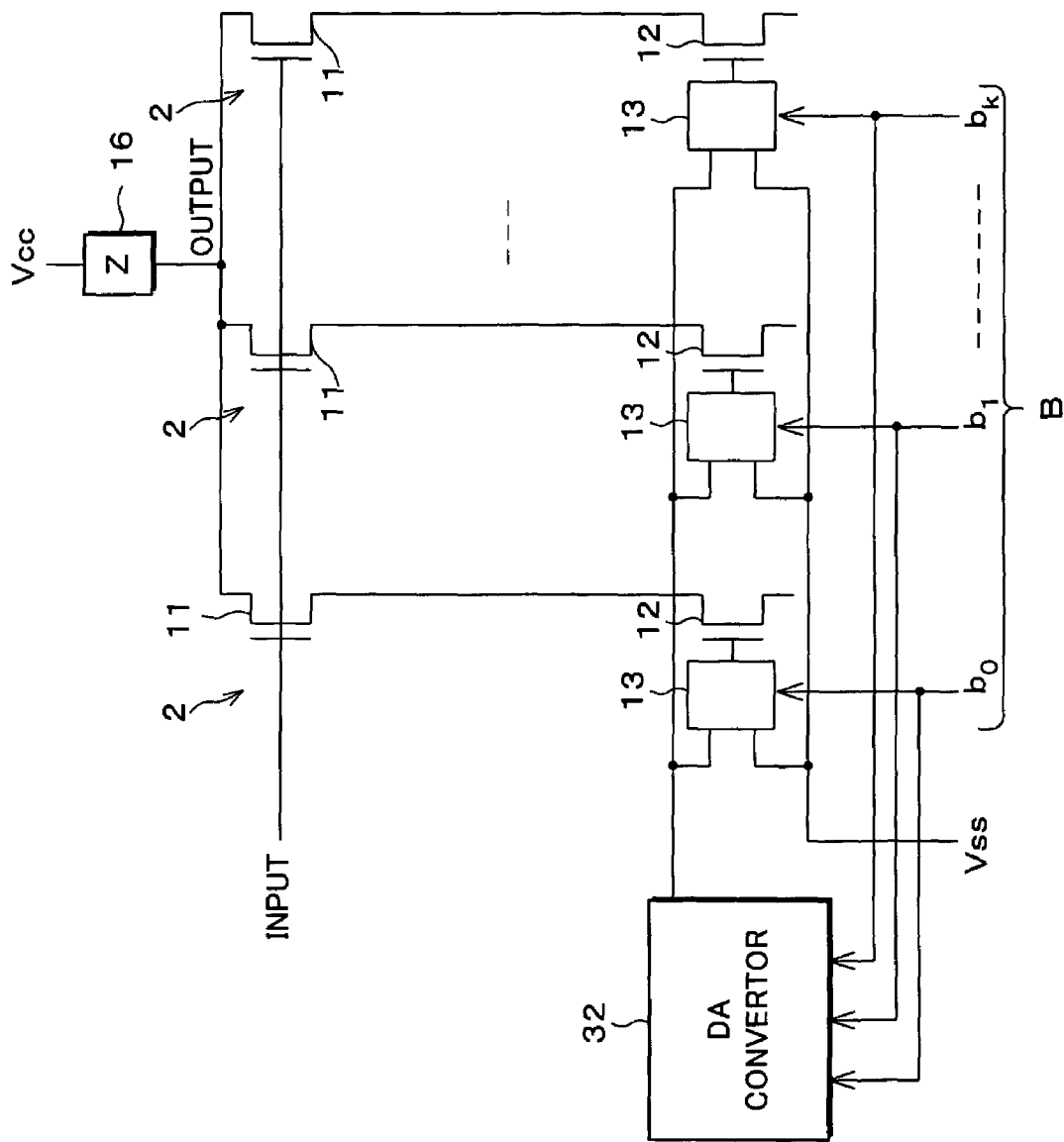
FIG. 10 is a circuit diagram showing a configuration of a variable gain amplifier according to the Fourth Embodiment of the present invention.

A variable gain amplifier of this embodiment is adapted to have a configuration, as shown in FIG. 10, in which the output of the variable gain amplifier shown in FIG. 7 is connected to the other power source via a load impedance 16. This power source generates a power voltage Vcc (high potential power voltage), by which the output current is converted to a voltage. That is, a variable gain amplifier of a voltage-input and voltage-output type is realized.

Note that, such a configuration is applicable to not only the variable gain amplifier of FIG. 7 but also to the variable gain amplifiers of FIG. 1 through FIG. 6, and FIG. 8 as well.

[Fifth Embodiment]

Figure 11:
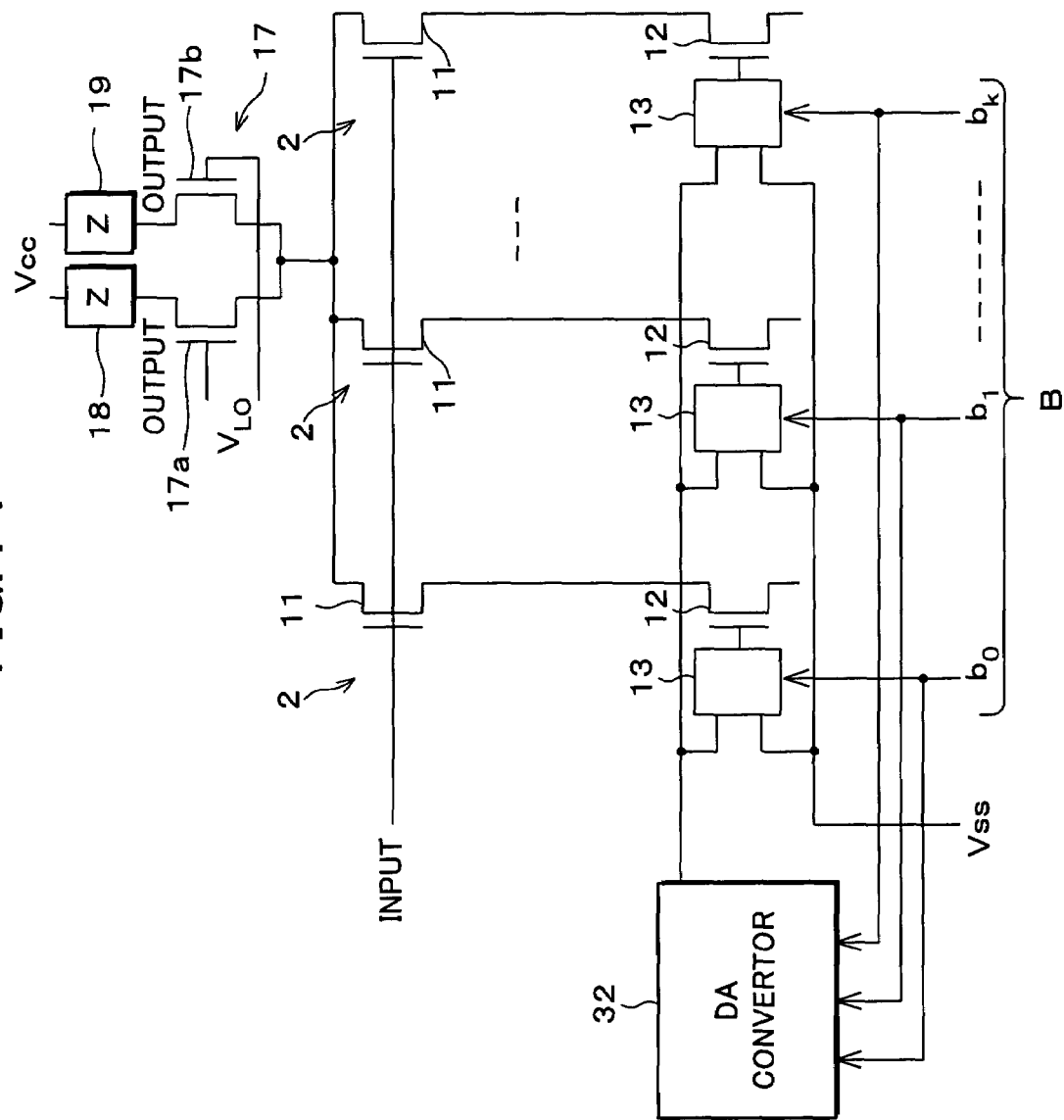
FIG. 11 is a circuit diagram showing a configuration of a variable gain amplifier according to the Fifth Embodiment of the present invention.
Figure 12:
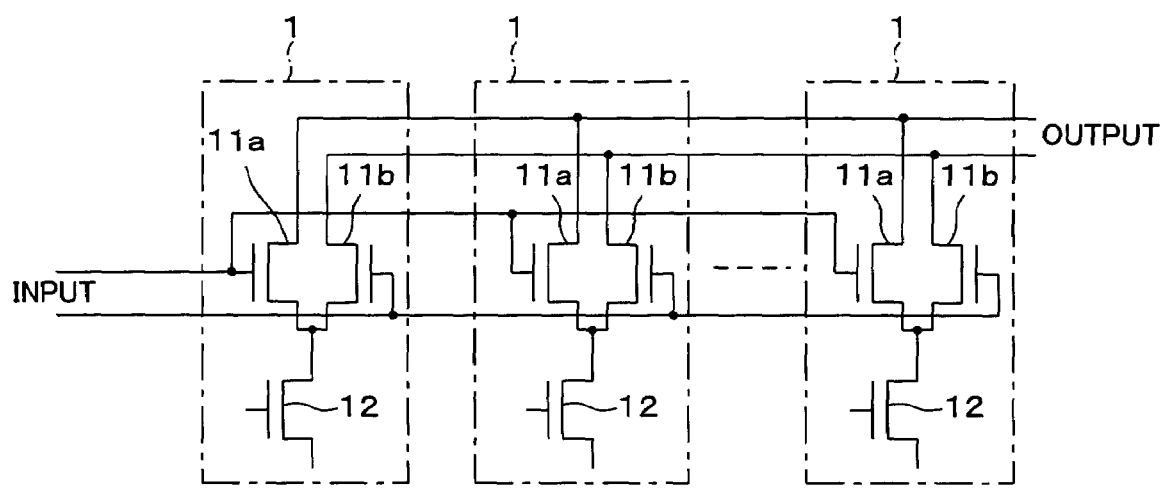
FIG. 12 is a circuit diagram showing a configuration of a variable gain amplifier according to the Sixth Embodiment of the present invention, in which signal input transistors of all unit circuits of the variable gain amplifier of FIG. 2 are realized by differential transistors.
Figure 13:
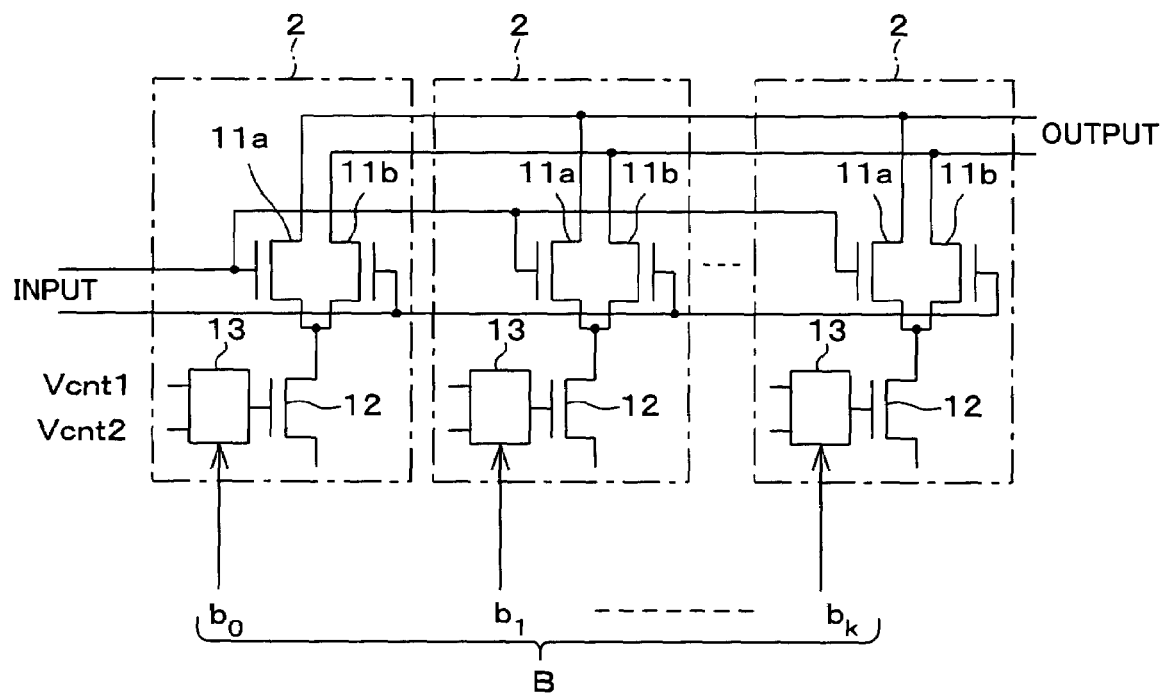
FIG. 13 is a circuit diagram showing a configuration of a variable gain amplifier according to the Sixth Embodiment of the present invention, in which signal input transistors of all unit circuits of the variable gain amplifier of FIG. 3(a) are realized by differential transistors.
Figure 14:
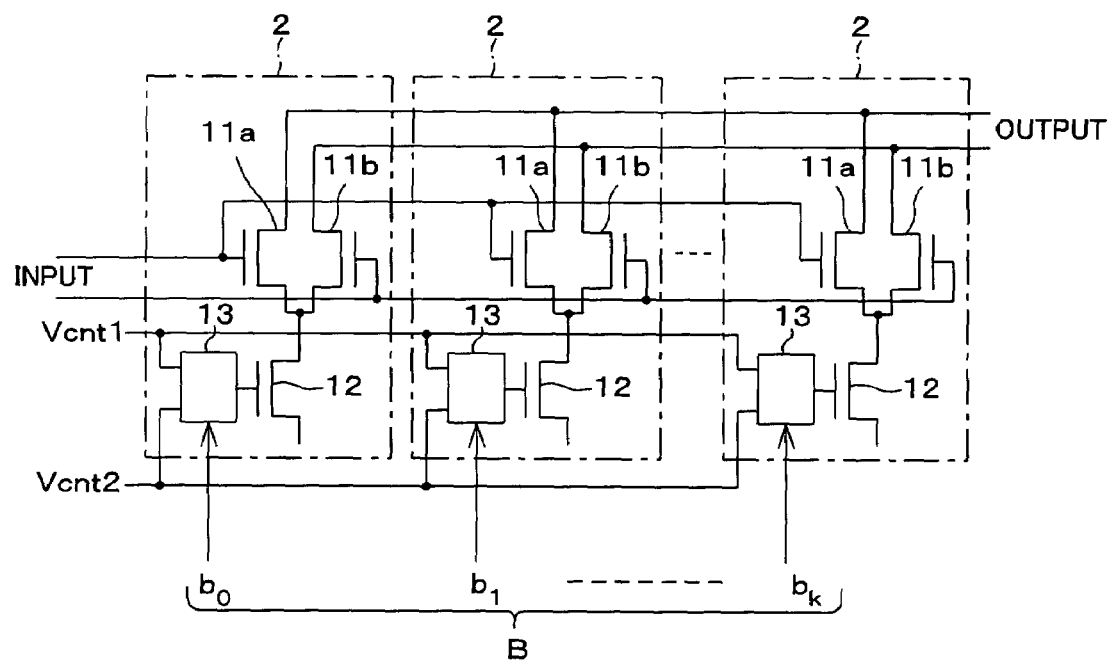
FIG. 14 is a circuit diagram showing a configuration of a variable gain amplifier according to the Sixth Embodiment of the present invention, in which signal input transistors of all unit circuits of the variable gain amplifier of FIG. 4 are realized by differential transistors.
Figure 15:
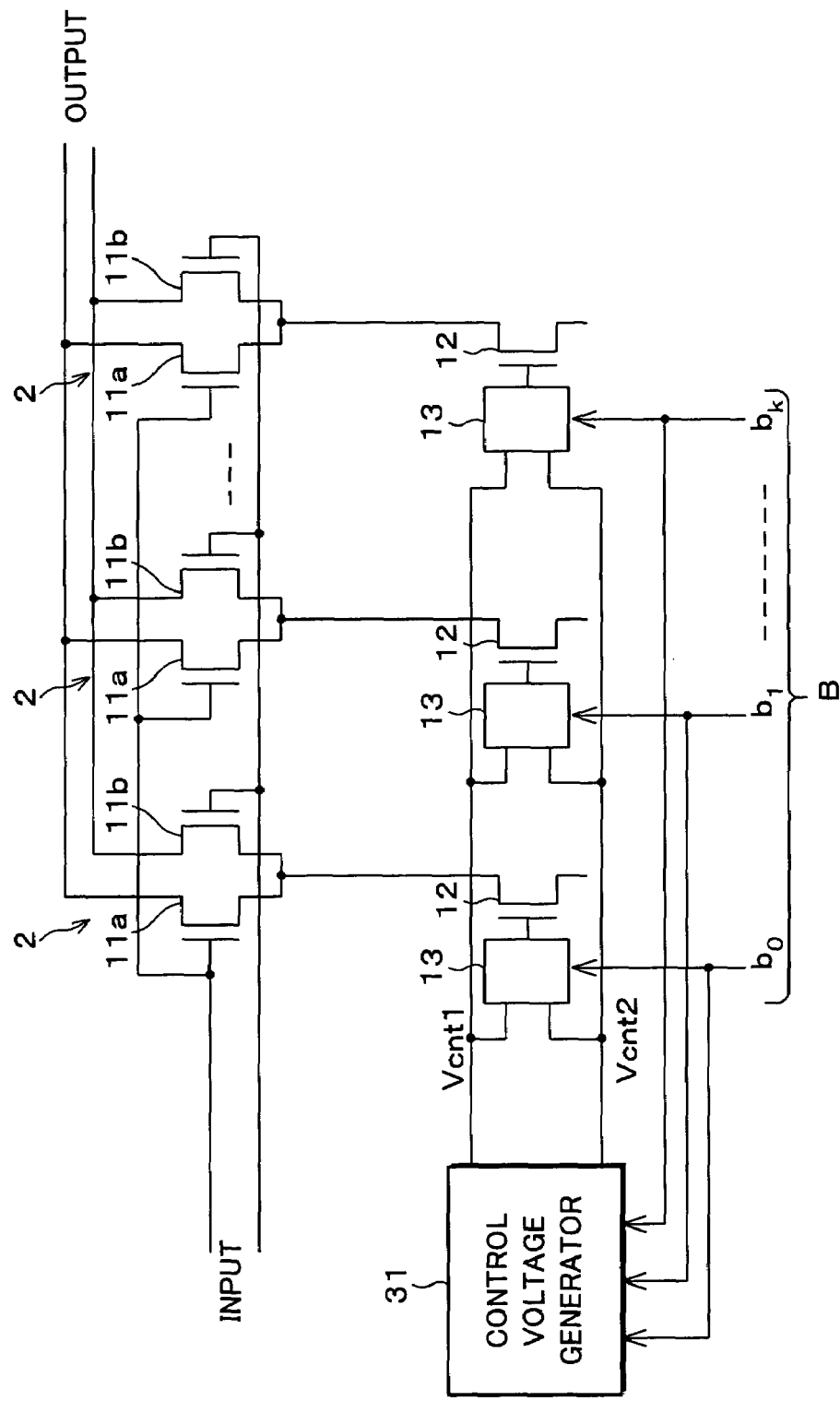
FIG. 15 is a circuit diagram showing a configuration of a variable gain amplifier according to the Sixth Embodiment of the present invention, in which signal input transistors of all unit circuits of the variable gain amplifier of FIG. 5 are realized by differential transistors.
Figure 16:
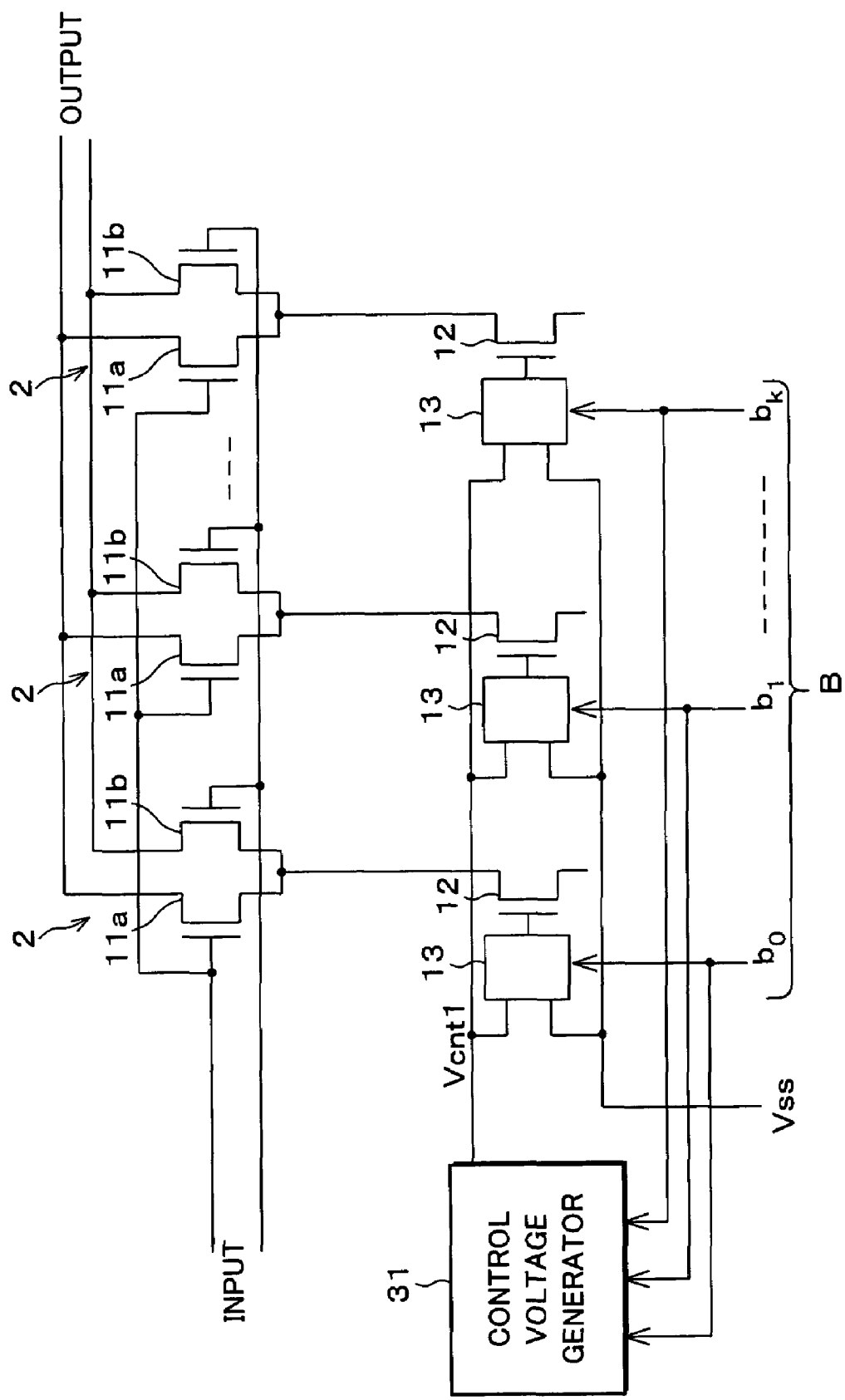
FIG. 16 is a circuit diagram showing a configuration of a variable gain amplifier according to the Sixth Embodiment of the present invention, in which signal input transistors of all unit circuits of the variable gain amplifier of FIG. 6 are realized by differential transistors.

A variable gain amplifier according to this embodiment is configured so that, as shown in FIG. 11, the output of the variable gain amplifier of FIG. 7 is connected to two load impedances 18 and 19 via a transistor differential pair 17, and eventually to the lines of power voltages Vcc. The transistor differential pair 17 is made up of transistors 17a and 17b which receive oscillation signals $V_{LO}$, which are 180° out of phase from each other, respectively at their gates. This configuration realizes a mixer with a variable gain control function.

By integrating the amplifier and the mixer as in the present embodiment, instead of providing them in a cascade connection as usually done, there will be only one voltage/current conversion site at which linearity of the circuit deteriorates. Therefore, with the configuration of the present embodiment, linearity of the circuit can be readily improved.

Note that, the foregoing configuration is applicable not only to the variable gain amplifier of FIG. 7 but also to the variable gain amplifiers of FIG. 1 through FIG. 6, and FIG. 8.

Further, the variable gain amplifier of the present embodiment may be provided with another transistor differential pair, similar to and in addition to the transistor differential pair 17, so as to have a configuration with transistor differential pairs 20 and 22 (see FIG. 21) according to the Eighth Embodiment which is to be described later. In such a configuration, the source of the additional transistor differential pair is connected to the output of the variable gain amplifier, and the differential outputs of the additional transistor differential pair are connected to two different load impedances (e.g., load impedances 24 and 25 in FIG. 21), respectively. Further, one transistor differential pair receives an oscillation signal (e.g., oscillation signal $V_{LO}$I) similar to the oscillation signal $V_{LO}$, while the other transistor differential pair receives an oscillation signal (e.g., oscillation signal $V_{LO}Q$) which is 90° out of phase from the other oscillation signal.

In this configuration, one transistor differential pair outputs a signal of a certain component, while the other transistor differential pair outputs a signal of a component which is 90° out of phase from the other, thus realizing a mixer with the variable gain control function, capable of outputting two different signal components.

[Sixth Embodiment]

In the variable gain amplifiers of the First through Fifth Embodiments, the input and output signals are not fully differential signals. The present embodiment provides a circuit which produces fully differential signals for the input and output signals, so as to provide a circuit which is highly resistant to fluctuation of power voltage or ground voltage.

FIG. 12 through FIG. 19 show variable gain amplifiers, analogous to the variable gain amplifiers of FIG. 2 through FIG. 8, and FIG. 10, respectively, which are configured to have fully differential input and output. More specifically, the variable gain amplifiers of FIG. 12 through FIG. 19 have a differential pair of signal input transistors 11a and 11b, instead of the signal input transistor 11.

Figure 18:
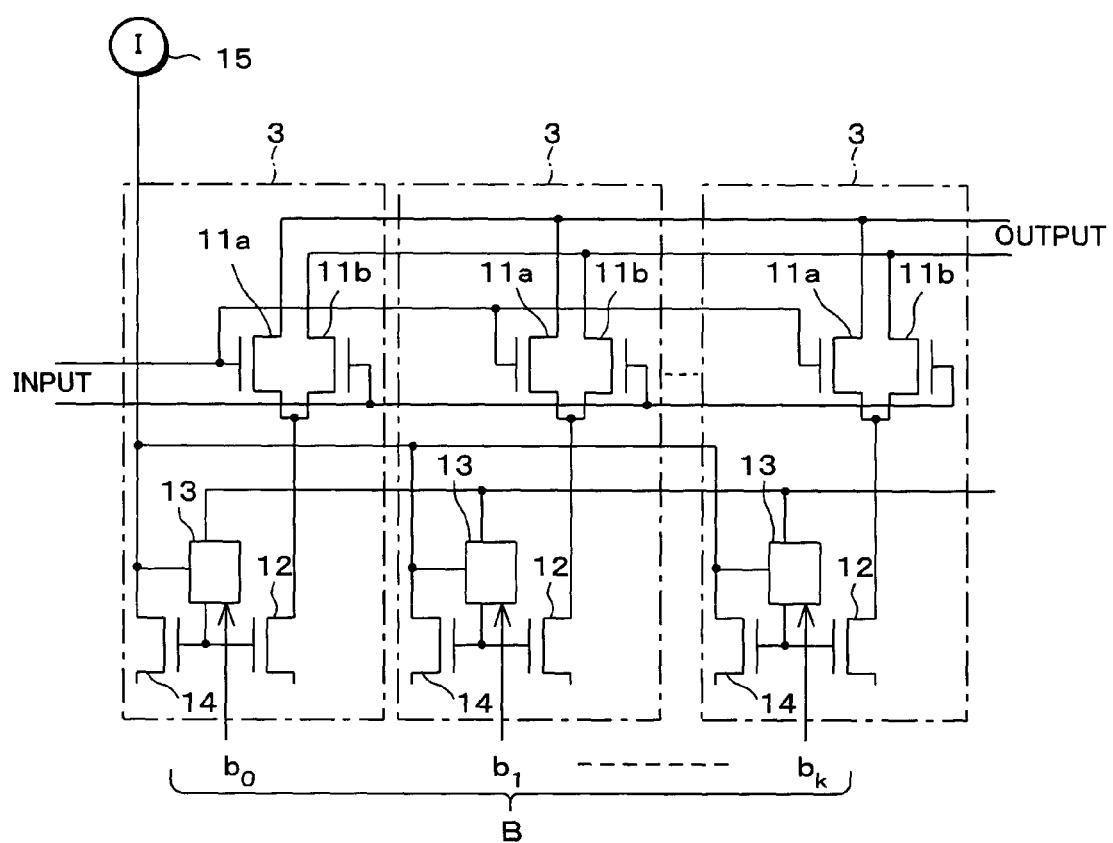
FIG. 18 is a circuit diagram showing a configuration of a variable gain amplifier according to the Sixth Embodiment of the present invention, in which signal input transistors of all unit circuits of the variable gain amplifier of FIG. 8 are realized by differential transistors.
Figure 19:
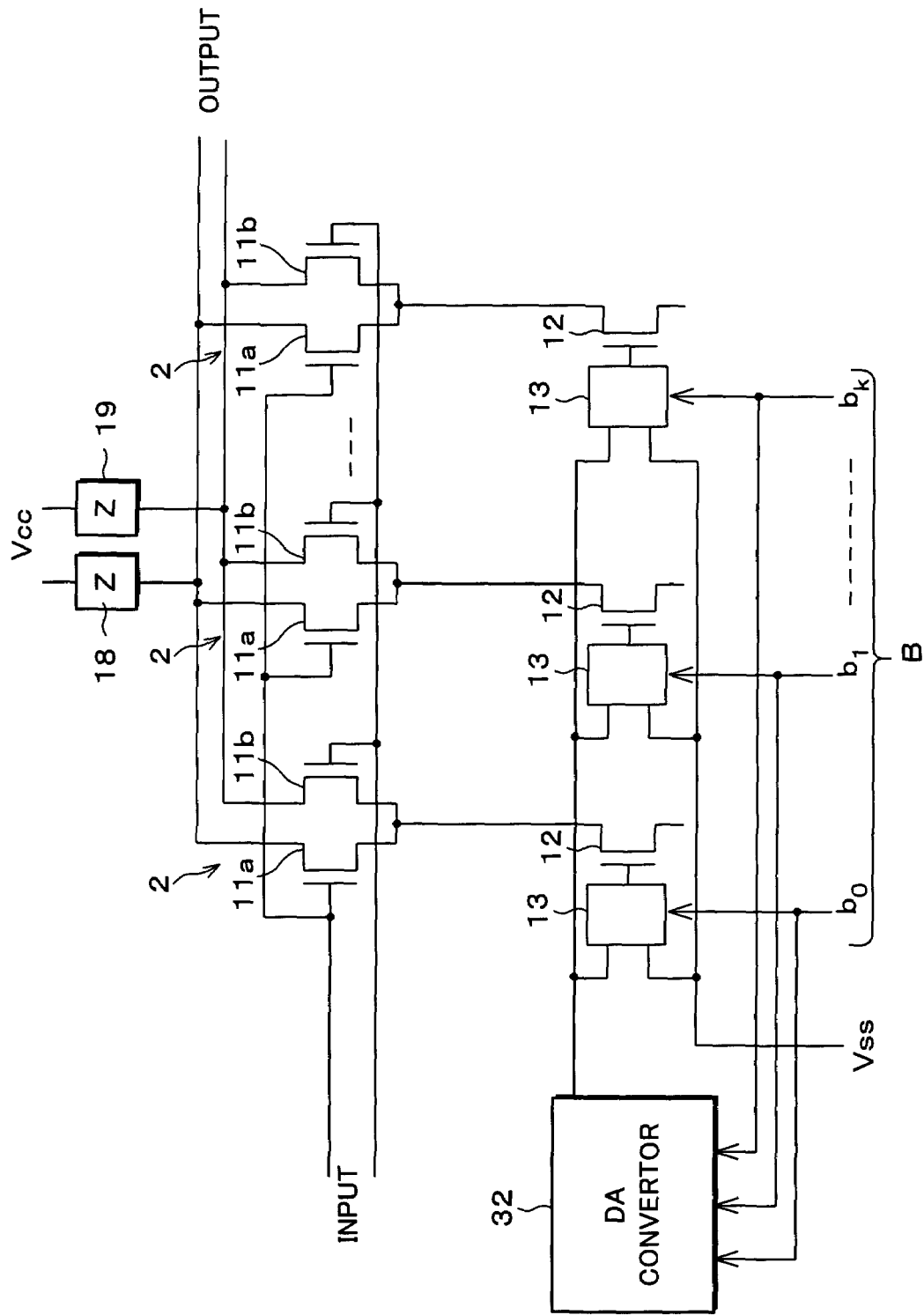
FIG. 19 is a circuit diagram showing a configuration of a variable gain amplifier according to the Sixth Embodiment of the present invention, in which signal input transistors of all unit circuits of the variable gain amplifier of FIG. 10 are realized by differential transistors.

As a representative example of the variable gain amplifiers of the present embodiment, the following describes a configuration as shown in FIG. 18 (analogous to the variable gain amplifier of FIG. 8).

In the configuration shown in FIG. 18, the source of the signal input transistors 11a and 11b is connected to the drain of the current control transistor 12, and the gate of the current control transistor 12 is connected to the gate of the current control transistor 14 and to the output terminal of the current control switch 13. One input terminal of the current control switch 13 receives the power voltage Vss, and the other input terminal is connected to the drain of the current control transistor 14. Further, the drain of the current control transistor 14 of each unit circuit 3 is connected to the current source 15.

The unit circuits 3 are connected to one another through their differential signal inputs and differential signal outputs. That is, the signal input transistors 11a and the signal input transistors 11b are respectively connected to one another in the gate path to make up the differential signal inputs. Similarly, the signal input transistors 11a and the signal input transistors 11b are respectively connected to one another in the drain path to make up the differential signal outputs.

In this configuration, the current control transistors 12 and 14 become ON/OFF all in the same manner across the unit circuits 3, regardless of the digital input value of the switch control signal B (except for the case where all bits are 0). Thus, the current through the signal input transistors 11a and 11b is maintained at the current value I of the current source 15, regardless of the size of the signal input transistors 11a or 11b. As a result, a variable gain amplifier with fully differential input and output can be realized, in which the voltage Vod and IIP3 are increased when the size of the signal input transistor 11a or 11b becomes smaller and a gain is reduced.

[Seventh Embodiment]

A variable gain mixer according to this embodiment is configured based on the differential variable gain amplifiers of FIG. 12 through FIG. 18. As a representative example of the present embodiment, the following describes a configuration based on the differential variable gain amplifier of FIG. 17.

Figure 17:
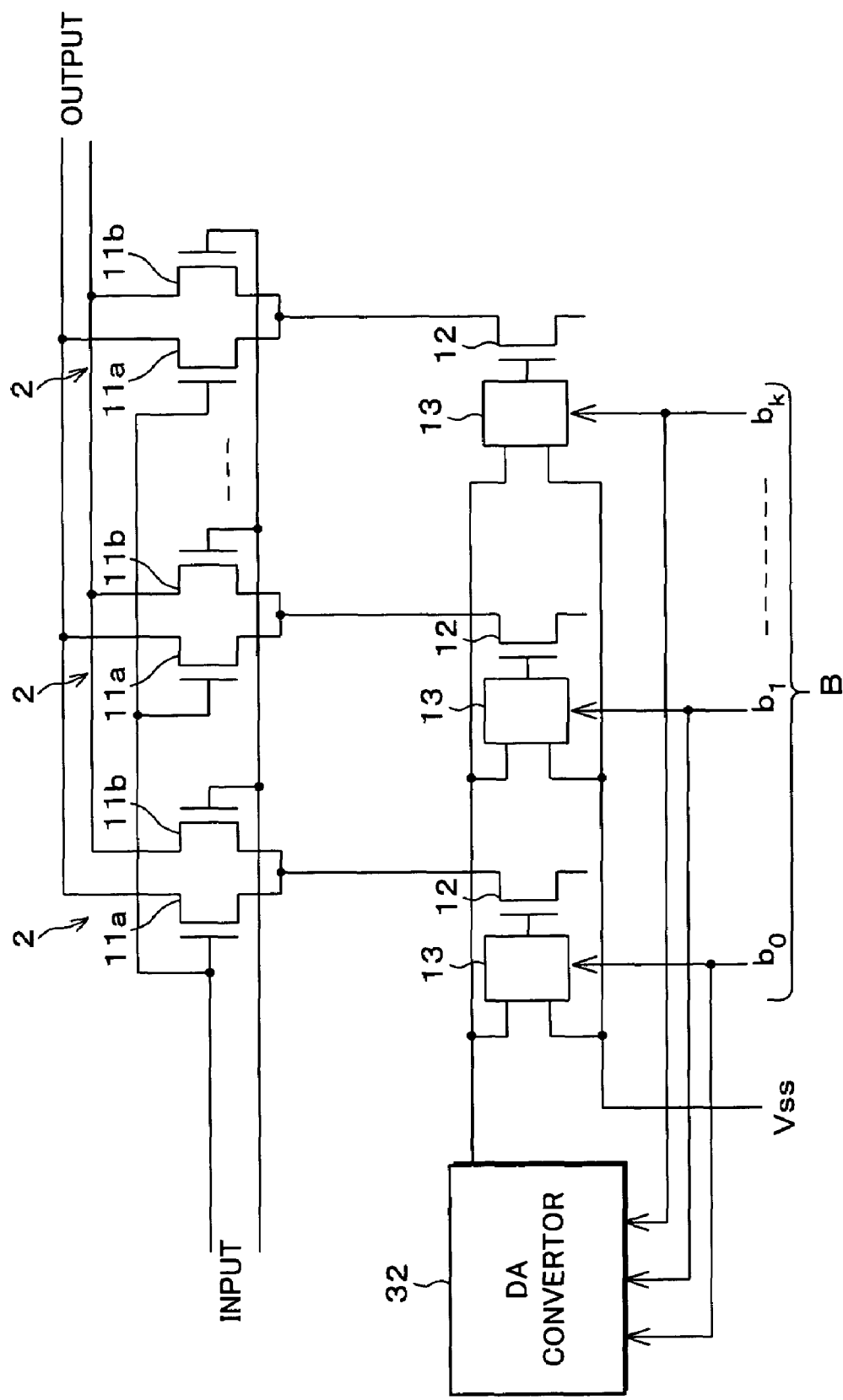
FIG. 17 is a circuit diagram showing a configuration of a variable gain amplifier according to the Sixth Embodiment of the present invention, in which signal input transistors of all unit circuits of the variable gain amplifier of FIG. 7 are realized by differential transistors.
Figure 20:
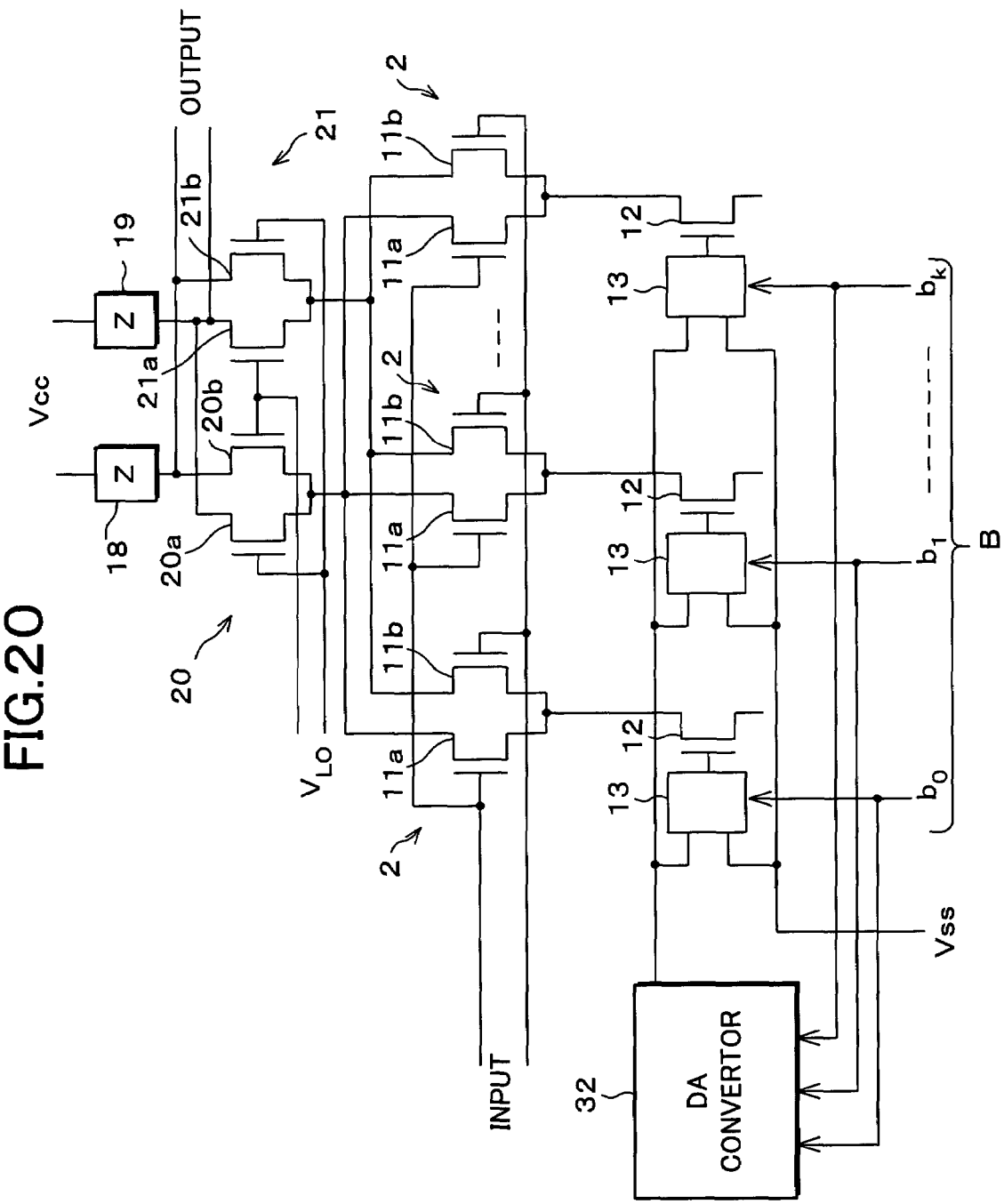
FIG. 20 is a circuit diagram showing a configuration of a variable gain mixer using differential transistors according to the Seventh Embodiment of the present invention.

A variable gain mixer as shown in FIG. 20 is configured to additionally include transistor differential pairs 20 and 21 and load impedances 18 and 19 in the configuration of the variable gain amplifier of FIG. 17.

The transistor differential pair 20 (first transistor differential pair) is made up of transistors 20a and 20b which are connected to each other in parallel. The transistor differential pair 21 (second transistor differential pair) is made up of transistors 21a and 21b which are connected to each other in parallel. The source of the transistor differential pairs 20 and 21 is connected to the output (drain) of the transistors 11a and 11b, which are differential outputs of each unit circuit 2. The transistor differential pair 20 and the transistor differential pair 21 are connected to each other through their differential inputs. More specifically, the transistors 20a and 21b are connected to each other in the gate path, and the transistors 20b and 21a are connected to each other in the gate path. Further, their junctions receive oscillation signals $V_{LO}$ which are 180° out of phase from each other, respectively.

Further, the differential outputs of the transistor differential pairs 20 and 21 are cross-connected. More specifically, the output of the transistor 20a is connected to the output of the transistor 21a, and the output of the transistor 20b is connected to the output of the transistor 21b. Further, the outputs of the transistors 20a and 21a are connected to the line of the power voltage Vcc via the load impedance 19, and the outputs of the transistors 20b and 21b are connected to the line of the power voltage Vcc via the load impedance 18.

By integrating the amplifier and the mixer as in the present embodiment, instead of providing them in a cascade connection as usually done, there will be only one voltage/current conversion site at which linearity of the circuit deteriorates. Therefore, with the configuration of the present embodiment, linearity of the circuit can be readily improved.

Note that, the foregoing configuration is applicable not only to the variable gain amplifier of FIG. 17 but also to the variable gain amplifiers of FIG. 12 through FIG. 16, and FIG. 18.

[Eighth Embodiment]

Figure 21:
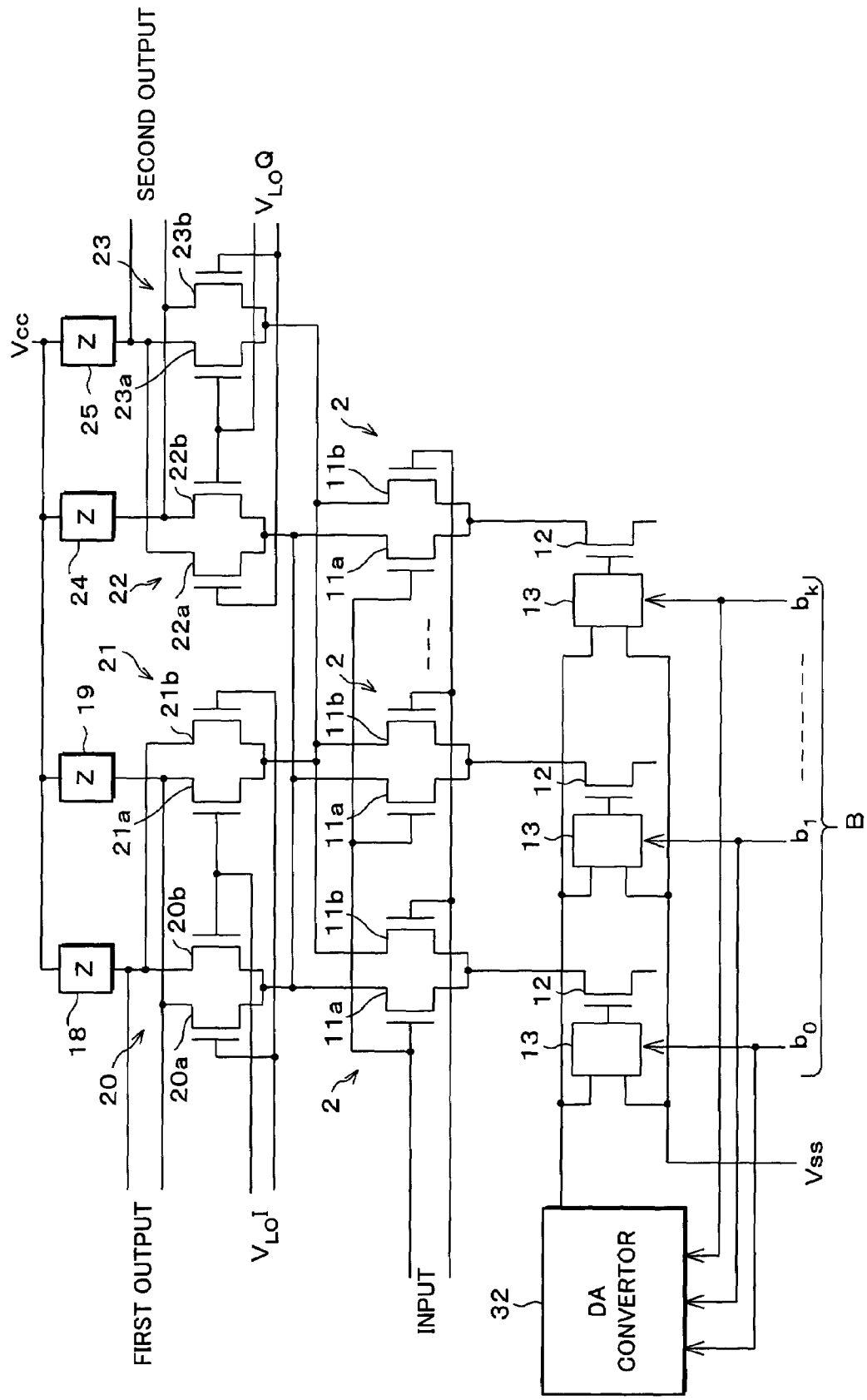
FIG. 21 is a circuit diagram showing a configuration of a variable gain mixer using differential transistors according to the Eighth Embodiment of the present invention.

As shown in FIG. 21, a variable gain mixer according to this embodiment is configured based on the fully differential variable gain amplifiers of FIG. 12 through FIG. 18. The variable gain mixer of the present embodiment is a mixer with a variable gain control function which is required for a receiver in wireless communications to extract signal components that are 90° out of phase from each other. As a representative example of the present embodiment, the following describes a configuration based on the differential variable gain amplifier of FIG. 17.

A variable gain mixer as shown in FIG. 21 includes, in addition to the configuration of the variable gain amplifier of FIG. 17, transistor differential pairs 20 through 23, and load impedances 18, 19, 24, and 25.

The differential outputs of the unit circuit 2 are connected to the transistor differential pairs 20 and 21, and the transistor differential pairs 20 and 21 are connected to each other, and to the load impedances 18 and 19, all in the same manner as in the variable gain mixer (FIG. 20) described in the Seventh Embodiment. Further, the differential inputs of the transistor differential pairs 20 and 21 receive oscillation signals $V_{LO}I$ (first oscillation signals) which are 180° out of phase from each other, as with the oscillation signals $V_{LO}$.

Further, the transistor differential pair 22 (third transistor differential pair) is made up of transistors 22a and 22b which are connected to each other in parallel, and the transistor differential pair 23 (fourth transistor differential pair) is made up of transistors 23*a* and 23*b* which are connected to each other in parallel. The transistor differential pairs 22 and 23 are connected to the outputs of the transistors 11*a* and 11*b*, respectively, which are differential outputs of the unit circuit 2. The transistor differential pair 22 and the transistor differential pairs 23 are connected to each other through the differential inputs. More specifically, the transistors 22*a* and 23*b* are connected to each other in the gate path, and the transistors 22*b* and 23*a* are connected to each other in the gate path. Further, their junctions receive an oscillation signal $V_{LO}Q$ (second oscillation signal) which is 90° out of phase from the oscillation signal $V_{LO}I$.

Further, the differential outputs of the transistor differential pairs 22 and 23 are cross-connected. More specifically, the output of the transistor 22*a* is connected to the output of the transistor 23*a*, and the output of the transistor 22*b* is connected to the output of the transistor 23*a*. Further, the outputs of the transistors 22*a* and 23*a* are connected to the line of power voltage Vcc via the load impedance 25, and the outputs of the transistors 22*b* and 23*b* are connected to the line of power voltage Vcc via the load impedance 24.

In this configuration, the first and second outputs have signal components which are 90° out of phase from each other, thus realizing a mixer with the variable gain control function, capable of outputting two different signal components.

According to this configuration, as in the foregoing embodiments, because the cascade connection of the amplifier and mixer is integrated, there is only one voltage/current conversion site, at which linearity of the circuit usually deteriorates. Therefore, with the configuration of the present embodiment, linearity of the circuit can be readily improved.

Note that, the foregoing configuration is applicable not only to the variable gain amplifier of FIG. 17 but also to the variable gain amplifiers of FIG. 12 through FIG. 16, and FIG. 18.

[Ninth Embodiment]

In the variable gain amplifier of FIG. 8 according to the Third Embodiment, Vod increases when the signal input transistor is reduced in size under constant current value. That is, the source voltage of the signal input transistor 11 approaches a level of power voltage Vss which cuts off a current flow into the current control transistor 12. As a result, the drain-source voltage Vds=Vd−Vs (where Vd is a drain voltage, and Vs is a source voltage) of the corresponding current control transistor 12 is decreased. Thus, when the current control transistor 12 is too small relative to the current value of the current source 15, the current control transistor 12 operates in the linear region of its characteristics, with the result that the amount of current copied from the current control transistor 14 to the current control transistor 12 is reduced.

Such a drawback can be overcome by the control of increasing the size of the current control transistor 12, when the size of the signal input transistor 11 is small, so that a sufficient current flow can be ensured even when the drain-source voltage Vds is low. The circuit shown in FIG. 22(*a*) is a variable impedance current mirror circuit 4 which has such a control function based on the configuration of FIG. 8.

The variable impedance current mirror circuit 4 includes a plurality of unit current mirror circuits 5 which are disposed in parallel. The unit current mirror circuits 5 are connected to one another through the current inputs and current outputs. Further, each unit current mirror circuit 5 has the current control transistors 12 and 14, and the current control switch 13.

The gate of the current control transistor 12 (first transistor) is connected to the gate of the current control transistor 14 (second transistor) and to the output terminal of the current control switch 13. One input terminal of the current control switch 13 receives the power voltage Vss, and the other input terminal of the current control switch 13 is connected to the drain of the current control transistor 14. Further, the drains of the current control transistors 14 of the unit current mirror circuits 5 are connected to the line of current input, while the drains of the current control transistors 12 of the unit current mirror circuits 5 are connected to the line of current output.

The variable impedance current mirror circuit 4 having the foregoing configuration is capable of varying the size (impedance) of the current mirror transistors (current control transistors 12 and 14) by controlling the value of the switch control signal B (B=b0, b1, . . . , bk, where k is an integer of not less than 0). For example, when B=0, i.e., when b0, b1, . . . , bk are all 0, all the transistors will become OFF, and there will be no output current flow. When any of b0, b1, . . . , bk is 1, the variable impedance current mirror circuit 4 comes into operation as a current mirror. Further, when b0, b1, . . . , bk are all 1, the size of the current mirror transistors becomes maximum and the output impedance becomes minimum.

Figure 22A:
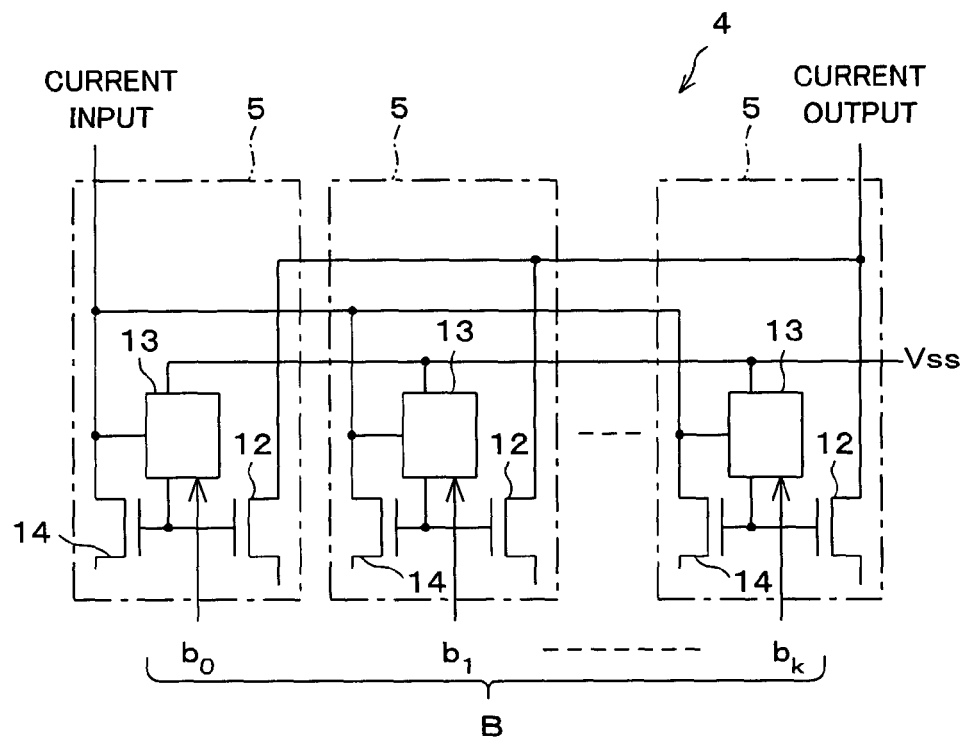
FIG. 22(a) is a circuit diagram showing a configuration of a variable impedance current mirror circuit according to the Ninth Embodiment of the present invention.
Figure 22B:
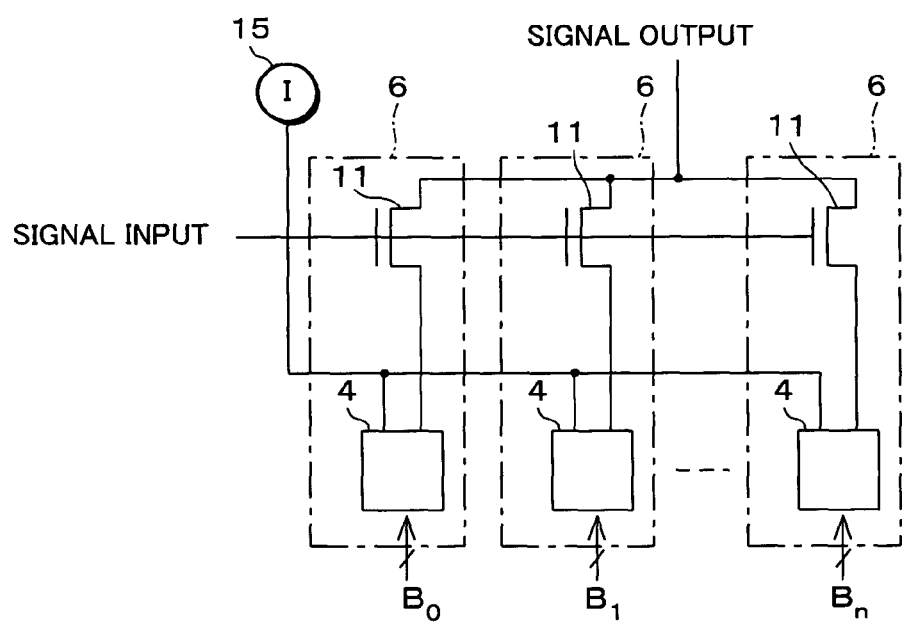
FIG. 22(b) is a circuit diagram showing a configuration of a variable gain amplifier with the variable impedance current mirror circuit.
Figure 23:
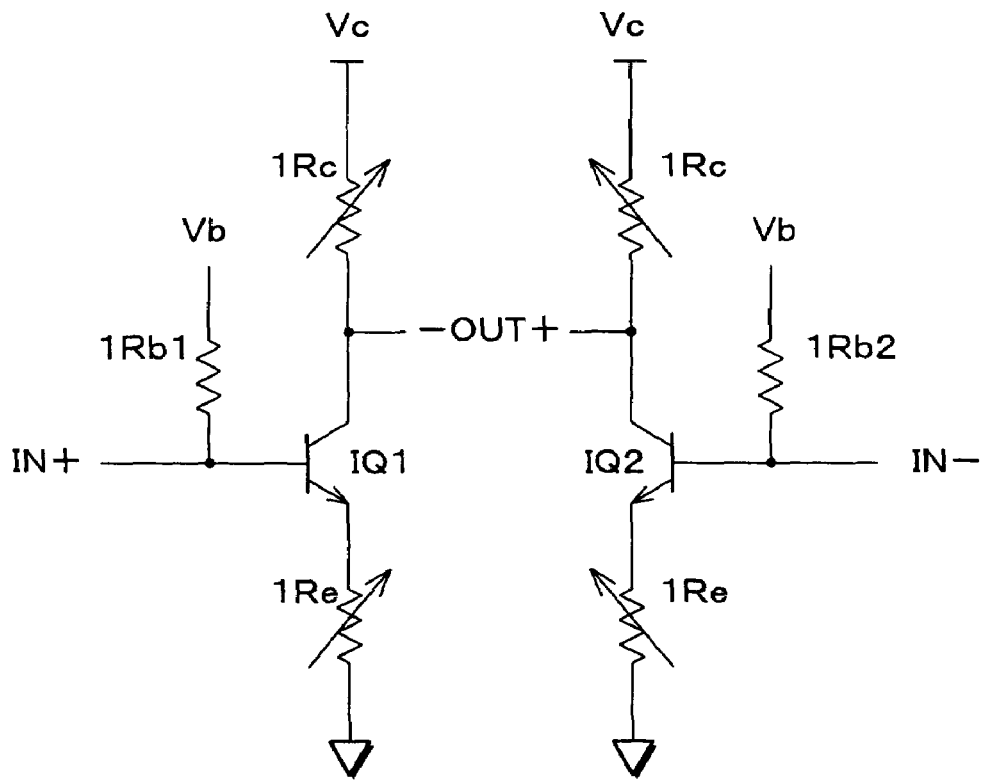
FIG. 23 is a circuit diagram showing a configuration of a conventional variable gain amplifier.
Figure 24:
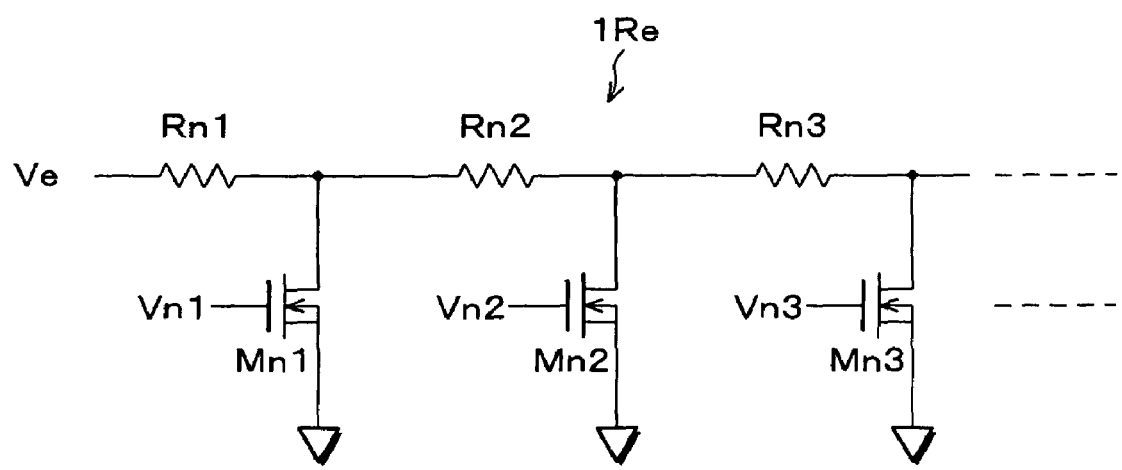
FIG. 24 is a circuit diagram showing a configuration of variable resistors in the variable gain amplifier of FIG. 23.
Figure 25:
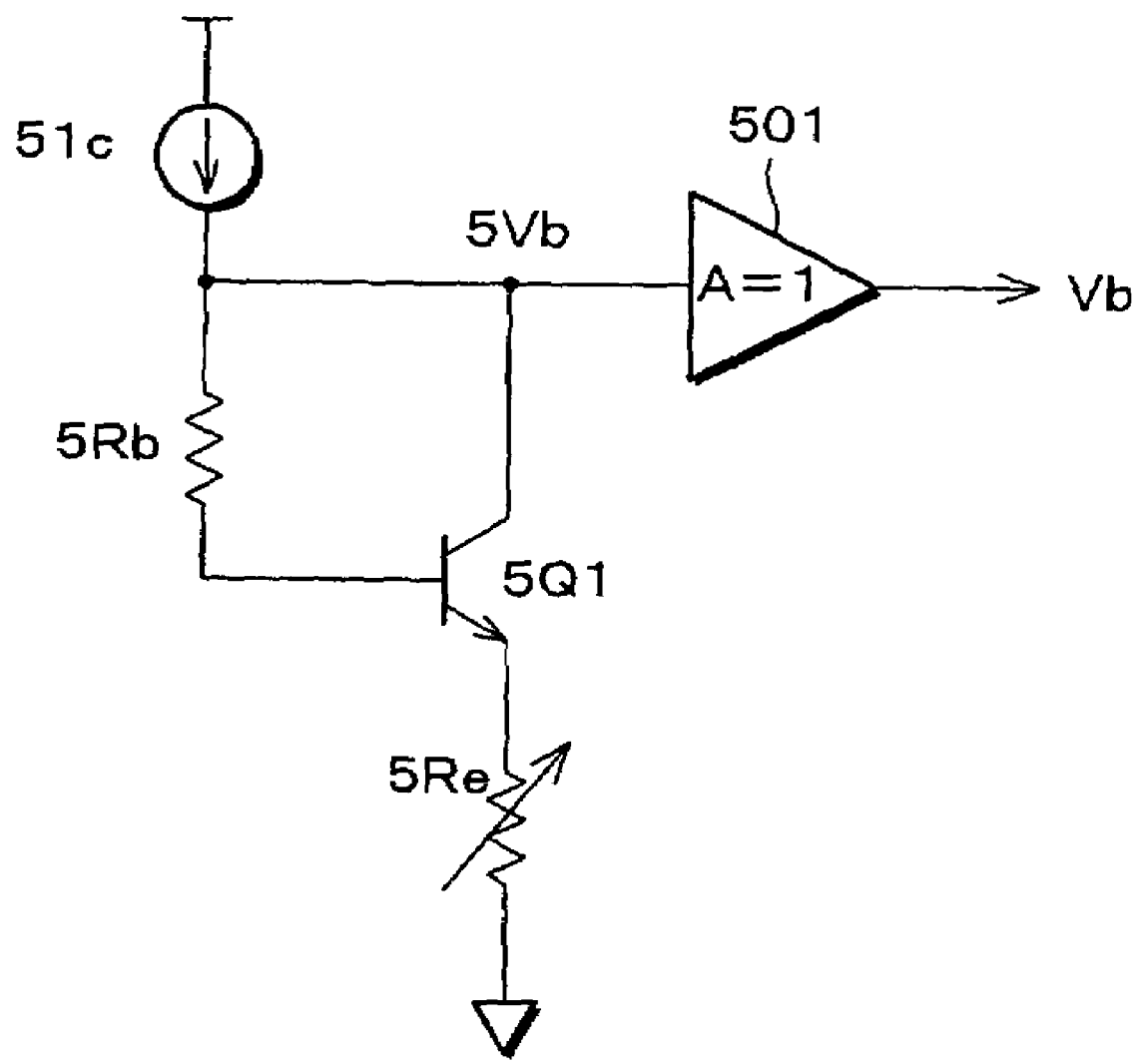
FIG. 25 is a circuit diagram showing a configuration of a bias voltage adjuster circuit in the variable gain amplifier of FIG. 23.

A variable gain amplifier shown in FIG. 22(*b*) has a plurality of unit circuits 6, each with the variable impedance current mirror circuit 4. The unit circuits 6 are disposed in parallel but not necessarily uniform in structure. Further, the unit circuits 6 have current inputs which are connected to the current source 15, and are connected to one another through the signal inputs and signal outputs. In the unit circuit 6, the current output of the variable impedance current mirror circuit 4 is connected to the source of the signal input transistor 11.

In the variable gain amplifier having the foregoing configuration, as in the Third Embodiment, the values of the switch control signals B0, B1, Bn are controlled to control a size of the signal input transistors 11 for amplification. In addition, when the size of the signal input transistor 11 is reduced, the variable gain amplifier carries out the control of increasing the size of the transistor of the variable impedance current mirror circuit 4 being conducted, so as to lower impedance. This solves the problem of reduced amount of current copied to the current control transistor 12 from the current control transistor 14.

Note that, even though the foregoing explanation of the present embodiment was based on the circuit of FIG. 8, it is also possible to replace the current control transistor 12 in the circuits of FIG. 2 through FIG. 7, and FIG. 10 through FIG. 21 with the corresponding part of the variable impedance current mirror circuit 4 of FIG. 22(*a*). With the variable gain amplifier of such a configuration, it is possible to prevent the current control transistor 12 from operating in the linear region of its characteristics, thereby widening the operating range of the current control transistor 12.

[Tenth Embodiment]

Figure 26:
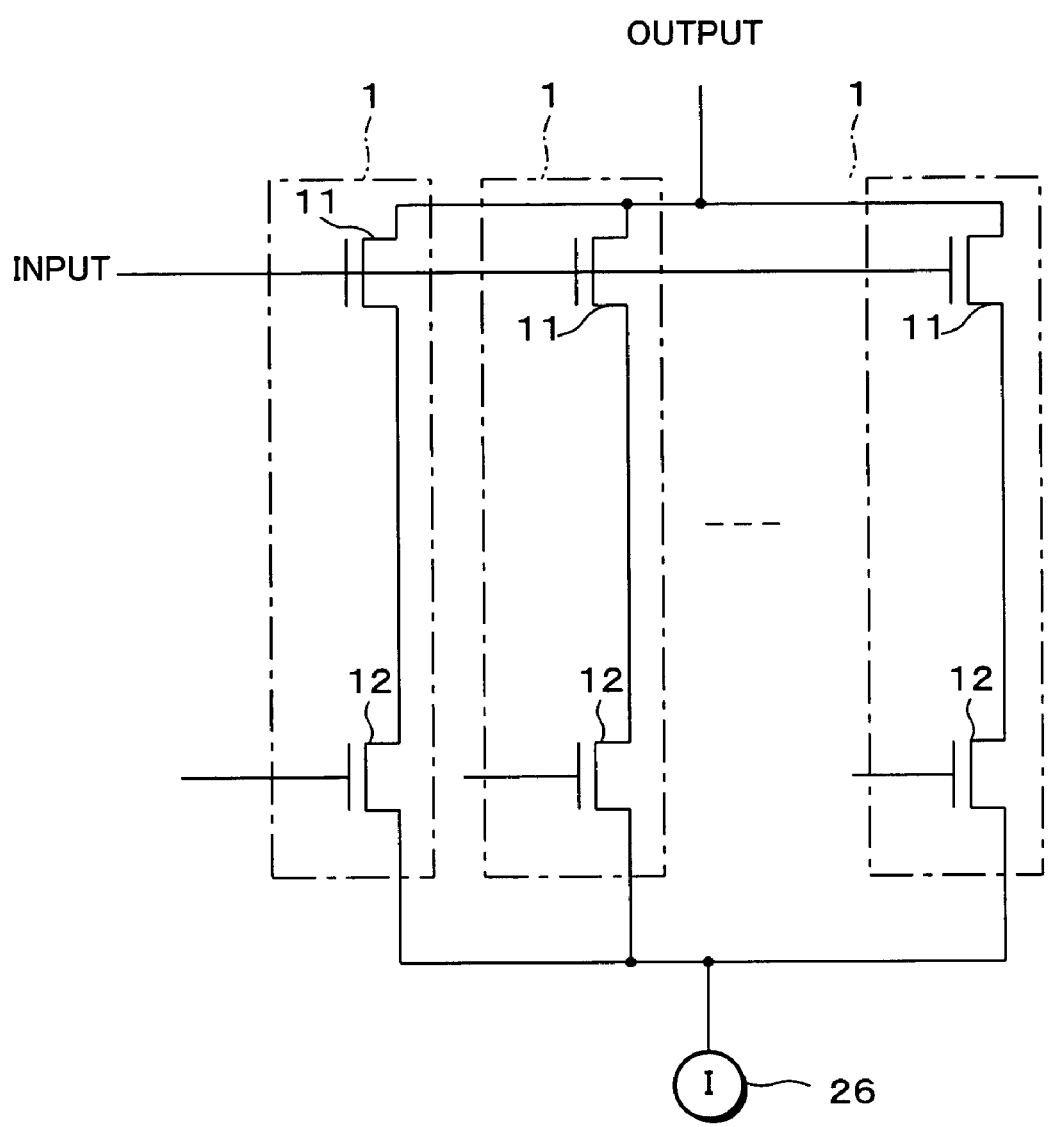
FIG. 26 is a circuit diagram showing a configuration of a variable gain amplifier according to the Tenth Embodiment of the present invention, which is provided with a common current source connected to current control transistors of the variable gain amplifier of FIG. 2.

As shown in FIG. 26, a variable gain amplifier according to the present embodiment has a configuration based on the variable gain amplifier of FIG. 2, wherein the drains of the current control transistors 12 of the unit circuits 1 are connected to a common current source 26 which supplies a current of constant value I.

In a variable gain amplifier having such a configuration, the current through the signal input transistors 11 is always held at the constant value I of the current source 26, regardless of the ON/OFF state of the current control transistors 12 (except for the case where all the transistors are OFF). Thus, when the number of OFF unit circuits is increased under constant current value of the current source 26, the size of the signal input transistors 11 becomes smaller to cause the gain to decrease and IIP3 to increase. Note that, the configuration in which the drains of the current control transistors 12 of the unit circuits 1 are connected to the common current source 26 is applicable to the variable gain amplifiers of FIG. 3(*a*), FIG. 4 through FIG. 7, FIG. 10 through FIG. 17, and FIG. 19 through FIG. 21.

[Eleventh Embodiment]

A variable gain amplifier according to the present embodiment is configured so that the size of signal input transistors 11 of the unit circuits becomes a progression of differences of geometric progressions, so that the displayed decibel value of the gain characteristics and IIP3 characteristics changes linearly as a function of the number of ON unit circuits.

The following explains a specific example of such a configuration based on the circuit of FIG. 8. The gain of this variable gain amplifier is controlled by the switch control signal B=(b0, b1, ..., bk).

Here, it is assumed that the gain is controlled at k levels. The gain becomes minimum when B=(1, 0, ..., 0), i.e., when b0=1, and when the other bits b1, ..., bk are all 0. The gain is second to minimum when B=(1, 1, 0, ..., 0), i.e., when b0=1 and b1=1 and the other bits b2, ..., bk are all 0. In this manner, the gain increases as the number of bits b0, b1, ..., bk with the value "1" is successively increased from b0, and therefore the gain becomes maximum when B=(1, 1, 1), i.e., when b0, b1, ..., bk are all 1.

It is also assumed here that the channel width of the signal input transistor 11 of the unit circuit 3 corresponding to a bit (switch control signal) bi is wi, and the channel width of the signal input transistors 11 with the gain of i levels (when all the current control transistors 12 of i=0 to k are ON) is Wi.

From this it follows that $$Wi = w0 + w1 + \ldots + wi \quad (4)$$

where i=0, 1, ..., k.

Here, constant R is defined as follows:

$$R = (Wk/W0)^{1/k}.$$

Further, the channel width wi of the signal input transistor 11 of the unit circuit 3 corresponding to a control signal bi is defined in such a manner that it becomes a progression of differences of geometric progression $W0 \times R^i$ and geometric progression $W0 \times R^{(i-1)}$, $$wi = W0 \times R^i - W0 \times R^{(i-1)} \quad (5),$$

where constant R is a common ratio, and i=1, ..., k.

Then, from Equation (4) and Equation (5), the following Equation (6) is established $$Wi = W0 \times R^i \quad (6),$$

where i=0, 1, ..., k. That is, it can be seen that the channel width Wi, which is the sum of channel widths wi of the signal input transistors 11 with the gain of i levels, is a geometric progression with a common ratio R. Further, since the gain is proportional to the power of Wi, Equation (6) indicates that the gain is linearly dependent on i in a decibel scale (logarithmic scale).

In reality, from Equation (3), the gain (transconductance gm) is proportional to the inverse square of Wi. Thus, from Equation (6), the following Equation (7) can be obtained.

$$Wi^{1/2} = W0^{1/2} \times R^{i/2} \quad (7).$$

If logarithm of Equation (7) is taken for a decibel scale, the right-hand side of the equation becomes $$\tfrac{1}{2} \times \log(W0) + i \times \tfrac{1}{2} \times \log(R).$$

This is a linear function of i, and therefore shows that the decibel value of gain is linearly dependent on the number i of the unit circuits 3.

As a result, a wide variable range can be obtained.

Note that, even though the explanation of the present embodiment was based on the circuit of FIG. 8, the foregoing configuration in which the decibel value of gain is linearly dependent on the number of unit circuits is also applicable to the circuits of FIG. 3 through FIG. 7, FIG. 10, FIG. 11, FIG. 13 through FIG. 22, and FIG. 26, which all use the switch control signal B.

A variable gain amplifier of a configuration underlying the foregoing embodiments includes: an amplifying transistor which amplifies an input signal; and a current path control section which controls a size of the amplifying transistor and a path of a current flow through the amplifying transistor.

It is preferable in the variable gain amplifier that the current path control section includes a current control transistor which controls a flow of a current through the amplifying transistor, and the variable gain amplifier further includes a plurality of unit circuits which are disposed parallel to one another, each having the amplifying transistor and the current control transistor, and are connected to one another through signal inputs and signal outputs of the unit circuits.

With this arrangement, by the control of the current control transistor, the current flow through the amplifying transistor can be independently controlled. For example, a current flow into the amplifying transistor of one of the unit circuits can be cut off to disable the amplifying transistor of this unit circuit, so that the amplifying transistor does not contribute to amplification of the input signal. This enables a size of the amplifying transistor to be controlled per unit circuit.

In the variable gain amplifier, it is preferable that each unit circuit has a switch control circuit which switches levels of operation control voltages for the current control transistor. This arrangement is preferable because it allows for more accurate control of a size of the amplifying transistor and a current flow through the amplifying transistor of each unit circuit.

It is preferable in the variable gain amplifier that common operation control voltages are inputted to the switch control circuit of each unit circuit. This arrangement is preferable because it requires less number of operation control voltages, which makes it possible to more easily control a current flow through the amplifying transistor.

It is preferable that the variable gain amplifier includes a voltage generator which generates the operation control voltages for each unit circuit based on a switch control signal which switches outputs of the switch control circuit. With this arrangement, the value of the operation control voltages can be varied according to the value of the switch control signal, so as to vary a size of the amplifying transistor and control an amount of current flow through the amplifying transistor more accurately.

It is also preferable that the operation control voltages are voltages of two levels: one cutting a current flow into the unit circuits; and the other allowing a current flow into the unit circuits. In this arrangement, when one operation control voltage cuts off a current flow and the amplifying transistor becomes smaller in size, the other operation control voltage can be controlled to maintain a constant current flow, by increasing the difference from the voltage level which cuts off the current flow. Thus, with this arrangement, a current flow can easily be controlled to hold it at a constant level.

It is preferable in the variable gain amplifier that the voltage generator varies the level of one of the operation control voltages according to the number of unit circuits with no current supply, so as to control a total amount of current flow through the remaining unit circuits. With this arrangement, it is possible to more accurately control a current flow through the unit circuits in the variable gain amplifier as a whole.

It is preferable in the variable gain amplifier that the voltage generator generates the operation control voltages so as to control and maintain the total amount of current flow at a constant level. With this arrangement, a decrease of the gain can always be compensated for by an increase of the IIP3 in the variable gain amplifier made up of the unit circuits flowing a current.

In the variable gain amplifier of a basic configuration according to the present invention, it is preferable that the current path control section varies a size of the amplifying transistor, and controls and maintains a current flow through the amplifying transistor at a constant level. With this arrangement, the current flow is maintained constant regardless of the size of the amplifying transistor. Therefore, a decrease of the gain in response to a reduced size of the amplifying transistor is accompanied by an increase of the IIP3. As a result, the gain and IIP3 can be controlled with more accurately.

It is preferable in the variable gain amplifier that the current path control section includes a current control transistor which controls a flow of a current through the amplifying transistor, and the variable gain amplifier includes: a plurality of unit circuits which are disposed parallel to one another and connected to one another through signal inputs and signal outputs of the unit circuits, each of the unit circuits including the amplifying transistor, the current control transistor, an auxiliary current control transistor which makes up a current mirror with the current control transistor, and a switch control circuit which switches levels of operation control voltages for the current control transistor and the auxiliary current control transistor; and a current source which supplies a constant current to the auxiliary current control transistor.

According to this arrangement, a constant current from the current source is flown into the auxiliary current control transistor, and the operation control voltage selected by the switch control circuit controls ON/OFF of the current control transistor and the auxiliary current control transistor which makes up a current mirror with the current control transistor. Thus, the constant current flown to the auxiliary current control transistor is also flown to the current control transistor, and as a result the same current is flown to the amplifying transistor. It is therefore possible to provide a variable gain amplifier in which the current control transistor and the auxiliary current control transistor can be realized by a simple MOS transistor structure to provide a circuit which can flow a constant current regardless of the size of the amplifying transistor. As a result, the variable gain amplifier can be provided at low cost.

It is preferable in the variable gain amplifier with the unit circuits that the amplifying transistor comprises an amplifying transistor differential pair. With this arrangement, the signals from the transistor differential pair become differential signals, which makes it possible to provide a circuit that is highly resistant to fluctuations of power voltage or ground voltage. As a result, a more reliable variable gain amplifier can be provided.

It is preferable in the variable gain amplifier with the unit circuits that the respective outputs of the unit circuits are connected to a power source via a load impedance. With this arrangement, the output current is converted to a voltage, thus realizing a variable gain amplifier of a voltage-input and voltage-output type.

It is preferable in the variable gain amplifier with the unit circuits includes: a transistor differential pair with a source which is connected to respective outputs of the unit circuits; and a load impedance which connects outputs of the transistor differential pair to a power source, wherein gates of transistors which make up the transistor differential pair receive oscillation signals which are 180° out of phase from each other. With this arrangement, a mixer with a variable gain control function can be realized. Consequently, the amplifier and the mixer, which are usually provided in a cascade connection, are integrated. This provides only one voltage/current conversion site at which linearity of the circuit deteriorates, thereby readily improving linearity of the circuit.

It is preferable that the variable gain amplifier includes: a first transistor differential pair and a second transistor differential pair, each being provided as the amplifying transistor differential pair, with differential outputs which are cross-connected to each other between the first transistor differential pair and the second transistor differential pair, the first transistor differential pair and the second transistor differential pair being connected to a source via different sides of the differential outputs; and a load impedance which connects outputs of the first and second transistor differential pairs to a power source, wherein gates of transistors which make up the first transistor differential pair and the second transistor differential pair receive oscillation signals which are 180° out of phase from each other. With this arrangement, a mixer with a variable gain control function by means of differential transistors can be realized. Consequently, the amplifier and the mixer, which are usually provided in a cascade connection, are integrated. This provides only one voltage/current conversion site at which linearity of the circuit deteriorates, thereby readily improving linearity of the circuit.

Further, the variable gain amplifier with the amplifying transistor differential pairs may be adapted to include: a first transistor differential pair and a second transistor differential pair, each being provided as the amplifying transistor differential pair, with differential outputs which are cross-connected to each other between the first transistor differential pair and the second transistor differential pair, the first transistor differential pair and the second transistor differential pair being connected to a source via different sides of the differential outputs; a third transistor differential pair and a fourth transistor differential pair, each being provided as the amplifying transistor differential pair, with differential outputs which are cross-connected to each other between the third transistor differential pair and the fourth transistor differential pair, the third transistor differential pair and the fourth transistor differential pair being connected to a source via different sides of the differential outputs; and a load impedance which connects outputs of the first through fourth transistor differential pairs to a power source, wherein differential inputs of the first and second transistor differential pairs receive first oscillation signals which are 180° out of phase from each other, and differential inputs of the third and fourth transistor differential pairs receive a second oscillation signal which is 90° out of phase from the first oscillation signals.

With this arrangement, the first and second transistor differential pairs and the third and fourth transistor differential pairs output signal components which are 90° out of phase. This makes it possible to realize a mixer with a variable gain control function, capable of outputting two different signal components. Consequently, the amplifier and the mixer, which are usually provided in a cascade connection, are integrated. This provides only one voltage/current conversion site at which linearity of the circuit deteriorates, thereby readily improving linearity of the circuit.

It is preferable that the variable gain amplifier with the unit circuits includes: a variable impedance current mirror circuit, in replacement of the current path control section, which is made up of a plurality of unit current mirror circuits which are disposed parallel to one another and connected to one another through current inputs and current outputs of the unit current mirror circuits, each of the unit current mirror circuits including a first transistor, a second transistor which is paired with the first transistor to make up a current mirror, and a switch circuit which switches levels of operation control voltages for the first and second transistors.

With this arrangement, when the size of the amplifying transistor is small, the variable impedance current mirror circuit increases the size of the current control transistor to provide a sufficient current flow. This ensures that a sufficient amount of current is copied to the current control transistor from the auxiliary current control transistor. As a result, it is possible to prevent the current control transistor from operating in the linear region of its characteristics, thereby widening the operating range of the current control transistor.

It is preferable that the variable gain amplifier with the unit circuits (except for the variable gain amplifier provided with the current source which supplies a constant current to the auxiliary current control transistor) includes a current source which supplies a constant current to the current control transistor of each unit circuit. With this arrangement, the current through the amplifying transistor takes the current value of the current source, regardless of the ON/OFF state of the current control transistor (except for the case where all the current control transistors are OFF). Thus, when the size of the amplifying transistors is reduced in response to the increased number of OFF unit circuits under maintained constant current value of the current source, a decrease of the gain can be accompanied by an increase of the IIP3. Therefore, the gain and IIP3 can be readily controlled.

It is preferable in the variable gain amplifier with the switch control signal that the switch control signal takes a value of either 0 or 1 to activate or deactivate the current control transistor, and a channel width of the amplifying transistor satisfies $$wi = W0 \times R^i - W0 \times R^{(i-1)},$$

where R is a constant which satisfies $$R = (Wk/W0)^{1/k},$$

where wi is a channel width of the amplifying transistor of the unit circuit which corresponds to the switch control signal of an ordinal number i (0, 1, 2, k; where k is an integer of not less than 0), and Wi is a channel width of i numbers of amplifying transistors whose gain is obtained when i is increased step-wise from 0 by the increment of 1 to increase the number of activated unit circuits according to the operation control voltage which was selected according to the switch control signal to activate the unit circuits.

According to this arrangement, in order to vary a size of the amplifying transistor, the switch control signals with ordinal numbers i of 0 to k are used to successively select the operation control voltage which activates the current control transistors. This brings about a step-wise increase of the number of activated current control transistors and thus the number of corresponding unit circuits, thereby increasing the number of amplifying transistors, whose current flows are controlled by the activated current control transistors. The channel width Wi (sum channel width) of the amplifying transistors with the gain of i levels (all the amplifying transistors whose current flows are controlled by the activated current control transistors of i=0 to k) is represented by the sum of channel widths wi of the individual amplifying transistors, and the channel width wi of the amplifying transistor is defined in such a manner that it is represented by a progression of differences of geometric progression $W0 \times R^i$ and geometric progression $W0 \times R^{(i-1)}$, where constant R is a common ratio.

As a result, the sum channel width Wi becomes proportional to the power of constant R (see Equation (6) above). Further, the gain, which is determined by the number of activated amplifying transistors in response to conduction of the current control transistors, becomes proportional to the power of the sum channel width Wi. Therefore, the gain becomes linearly dependent on i in a decibel scale (logarithmic scale). As a result, a wide variable range can be obtained.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A variable gain amplifier, comprising:
   an amplifying transistor which amplifies an input signal; and
   a current path control section which adjusts a percentage of the amplifying transistor that contributes to amplification of the input signal and a path of a current through the amplifying transistor.

2. The variable gain amplifier as set forth in claim 1, wherein:
   the current path control section includes a current control transistor which controls a current flow through the amplifying transistor, said variable gain amplifier comprising: a plurality of unit circuits which are disposed parallel to one another, each having the amplifying transistor and the current control transistor, said unit circuits being connected to one another through signal inputs and signal outputs of the unit circuits.

3. The variable gain amplifier as set forth in claim 2, wherein the amplifying transistor comprises an amplifying transistor differential pair.

4. The variable gain amplifier as set forth in claim 3, further comprising:
   a first transistor differential pair and a second transistor differential pair, each being provided as the amplifying transistor differential pair, with differential outputs which are cross-connected to each other between the first transistor differential pair and the second transistor differential pair, the first transistor differential pair and the second transistor differential pair being connected to a source via different sides of the differential outputs; and
   a load impedance which connects outputs of the first and second transistor differential pairs to a power source,
   wherein gates of transistors which make up the first transistor differential pair and the second transistor differential pair receive oscillation signals which are 180° out of phase from each other.

5. The variable gain amplifier as set forth in claim 3, further comprising:
   a first transistor differential pair and a second transistor differential pair, each being provided as the amplifying transistor differential pair, with differential outputs which are cross-connected to each other between the first transistor differential pair and the second transistor differential pair, the first transistor differential pair and the second transistor differential pair being connected to a source via different sides of the differential outputs;
   a third transistor differential pair and a fourth transistor differential pair, each being provided as the amplifying transistor differential pair, with differential outputs which are cross-connected to each other between the third transistor differential pair and the fourth transistor differential pair, the third transistor differential pair and the fourth transistor differential pair being connected to a source via different sides of the differential outputs; and
   a load impedance which connects outputs of the first through fourth transistor differential pairs to a power source,
   wherein differential inputs of the first and second transistor differential pairs receive first oscillation signals which are 180° out of phase from each other, and differential inputs of the third and fourth transistor differential pairs receive a second oscillation signal which is 90° out of phase from the first oscillation signals.

6. The variable gain amplifier as set forth in claim 2, wherein respective outputs of the unit circuits are connected to a power source via a load impedance.

7. The variable gain amplifier as set forth in claim 2, further comprising:
   a transistor differential pair with a source which is connected to respective outputs of the unit circuits; and
   a load impedance which connects outputs of the transistor differential pair to a power source,
   wherein gates of transistors which make up the transistor differential pair receive oscillation signals which are 180° out of phase from each other.

8. The variable gain amplifier as set forth in claim 2, comprising:
   a variable impedance current mirror circuit, in replacement of the current path control section, which is made up of a plurality of unit current mirror circuits which are disposed parallel to one another and connected to one another through current inputs and current outputs of the unit current mirror circuits, each of the unit current mirror circuits including a first transistor, a second transistor which is paired with the first transistor to make up a current mirror, and a switch circuit which switches levels of operation control voltages for the first and second transistors.

9. The variable gain amplifier as set forth in claim 2, further comprising:
   a current source which supplies a constant current to the current control transistor of each unit circuit.

10. The variable gain amplifier as set forth in claim 2, wherein each unit circuit includes a switch control circuit which switches levels of operation control voltages for the current control transistor.

11. The variable gain amplifier as set forth in claim 10, wherein the amplifying transistor makes up an amplifying transistor differential pair.

12. The variable gain amplifier as set forth in claim 11, further comprising:
   a first transistor differential pair and a second transistor differential pair, each being provided as the amplifying transistor differential pair, with differential outputs which are cross-connected to each other between the first transistor differential pair and the second transistor differential pair, the first transistor differential pair and the second transistor differential pair being connected to a source via different sides of the differential outputs; and
   a load impedance which connects outputs of the first and second transistor differential pairs to a power source,
   wherein gates of transistors which make up the first transistor differential pair and the second transistor differential pair receive oscillation signals which are 180° out of phase from each other.

13. The variable gain amplifier as set forth in claim 11, further comprising:
   a first transistor differential pair and a second transistor differential pair, each being provided as the amplifying transistor differential pair, with differential outputs which are cross-connected to each other between the first transistor differential pair and the second transistor differential pair, the first transistor differential pair and the second transistor differential pair being connected to a source via different sides of the differential outputs;
   a third transistor differential pair and a fourth transistor differential pair, each being provided as the amplifying transistor differential pair, with differential outputs which are cross-connected to each other between the third transistor differential pair and the fourth transistor differential pair, the third transistor differential pair and the fourth transistor differential pair being connected to a source via different sides of the differential outputs; and
   a load impedance which connects outputs of the first through fourth transistor differential pairs to a power source,
   wherein differential inputs of the first and second transistor differential pairs receive first oscillation signals which are 180° out of phase from each other, and differential inputs of the third and fourth transistor differential pairs receive a second oscillation signal which is 90° out of phase from the first oscillation signals.

14. The variable gain amplifier as set forth in claim 10, wherein respective outputs of the unit circuits are connected to a power source via a load impedance.

15. The variable gain amplifier as set forth in claim 10, further comprising:
a transistor differential pair with a source which is connected to respective outputs of the unit circuits; and
a load impedance which connects outputs of the transistor differential pair to a power source,
wherein gates of transistors which make up the transistor differential pair receive oscillation signals which are 180° out of phase from each other.

16. The variable gain amplifier as set forth in claim 10, comprising:
a variable impedance current mirror circuit, in replacement of the current path control section, which is made up of a plurality of unit current mirror circuits which are disposed parallel to one another and connected to one another through current inputs and current outputs of the unit current mirror circuits, each of the unit current mirror circuits including a first transistor, a second transistor which is paired with the first transistor to make up a current mirror, and a switch circuit which switches levels of operation control voltages for the first and second transistors.

17. The variable gain amplifier as set forth in claim 10, further comprising:
a current source which supplies a constant current to the current control transistor of each unit circuit.

18. The variable gain amplifier as set forth in claim 10, wherein common operation control voltages are inputted to the switch control circuit of each unit circuit.

19. The variable gain amplifier as set forth in claim 18, wherein the amplifying transistor comprises an amplifying transistor differential pair.

20. The variable gain amplifier as set forth in claim 19, further comprising:
a first transistor differential pair and a second transistor differential pair, each being provided as the amplifying transistor differential pair, with differential outputs which are cross-connected to each other between the first transistor differential pair and the second transistor differential pair, the first transistor differential pair and the second transistor differential pair being connected to a source via different sides of the differential outputs; and
a load impedance which connects outputs of the first and second transistor differential pairs to a power source,
wherein gates of transistors which make up the first transistor differential pair and the second transistor differential pair receive oscillation signals which are 180ø out of phase from each other.

21. The variable gain amplifier as set forth in claim 19, further comprising:
a first transistor differential pair and a second transistor differential pair, each being provided as the amplifying transistor differential pair, with differential outputs which are cross-connected to each other between the first transistor differential pair and the second transistor differential pair, the first transistor differential pair and the second transistor differential pair being connected to a source via different sides of the differential outputs;
a third transistor differential pair and a fourth transistor differential pair, each being provided as the amplifying transistor differential pair, with differential outputs which are cross-connected to each other between the third transistor differential pair and the fourth transistor differential pair, the third transistor differential pair and the fourth transistor differential pair being connected to a source via different sides of the differential outputs; and
a load impedance which connects outputs of the first through fourth transistor differential pairs to a power source,
wherein differential inputs of the first and second transistor differential pairs receive first oscillation signals which are 180° out of phase from each other, and differential inputs of the third and fourth transistor differential pairs receive a second oscillation signal which is 90° out of phase from the first oscillation signals.

22. The variable gain amplifier as set forth in claim 18, wherein respective outputs of the unit circuits are connected to a power source via a load impedance.

23. The variable gain amplifier as set forth in claim 18, further comprising:
a transistor differential pair with a source which is connected to respective outputs of the unit circuits; and
a load impedance which connects outputs of the transistor differential pair to a power source,
wherein gates of transistors which make up the transistor differential pair receive oscillation signals which are 180° out of phase from each other.

24. The variable gain amplifier as set forth in claim 18, comprising:
a variable impedance current mirror circuit, in replacement of the current path control section, which is made up of a plurality of unit current mirror circuits which are disposed parallel to one another and connected to one another through current inputs and current outputs of the unit current mirror circuits, each of the unit current mirror circuits including a first transistor, a second transistor which is paired with the first transistor to make up a current mirror, and a switch circuit which switches levels of operation control voltages for the first and second transistors.

25. The variable gain amplifier as set forth in claim 18, further comprising:
a current source which supplies a constant current to the current control transistor of each unit circuit.

26. The variable gain amplifier as set forth in claim 18, comprising:
a voltage generator which generates the operation control voltages for each unit circuit based on a switch control signal which switches outputs of the switch control circuit.

27. The variable gain amplifier as set forth in claim 26, wherein the amplifying transistor comprises an amplifying transistor differential pair.

28. The variable gain amplifier as set forth in claim 27, further comprising:
a first transistor differential pair and a second transistor differential pair, each being provided as the amplifying transistor differential pair, with differential outputs which are cross-connected to each other between the first transistor differential pair and the second transistor differential pair, the first transistor differential pair and the second transistor differential pair being connected to a source via different sides of the differential outputs; and
a load impedance which connects outputs of the first and second transistor differential pairs to a power source,
wherein gates of transistors which make up the first transistor differential pair and the second transistor differential pair receive oscillation signals which are 180° out of phase from each other.

29. The variable gain amplifier as set forth in claim 27, further comprising:
a first transistor differential pair and a second transistor differential pair, each being provided as the amplifying transistor differential pair, with differential outputs which are cross-connected to each other between the first transistor differential pair and the second transistor differential pair, the first transistor differential pair and the second transistor differential pair being connected to a source via different sides of the differential outputs;
a third transistor differential pair and a fourth transistor differential pair, each being provided as the amplifying transistor differential pair, with differential outputs which are cross-connected to each other between the third transistor differential pair and the fourth transistor differential pair, the third transistor differential pair and the fourth transistor differential pair being connected to a source via different sides of the differential outputs; and
a load impedance which connects outputs of the first through fourth transistor differential pairs to a power source,
wherein differential inputs of the first and second transistor differential pairs receive first oscillation signals which are 180° out of phase from each other, and differential inputs of the third and fourth transistor differential pairs receive a second oscillation signal which is 90° out of phase from the first oscillation signals.

30. The variable gain amplifier as set forth in claim 26, wherein respective outputs of the unit circuits are connected to a power source via a load impedance.

31. The variable gain amplifier as set forth in claim 26, further comprising:
a transistor differential pair with a source which is connected to respective outputs of the unit circuits; and
a load impedance which connects outputs of the transistor differential pair to a power source,
wherein gates of transistors which make up the transistor differential pair receive oscillation signals which are 180° out of phase from each other.

32. The variable gain amplifier as set forth in claim 26, comprising:
a variable impedance current mirror circuit, in replacement of the current path control section, which is made up of a plurality of unit current mirror circuits which are disposed parallel to one another and connected to one another through current inputs and current outputs of the unit current mirror circuits, each of the unit current mirror circuits including a first transistor, a second transistor which is paired with the first transistor to make up a current mirror, and a switch circuit which switches levels of operation control voltages for the first and second transistors.

33. The variable gain amplifier as set forth in claim 26, further comprising:
a current source which supplies a constant current to the current control transistor of each unit circuit.

34. The variable gain amplifier as set forth in claim 26, wherein:
the switch control signal takes a value of either 0 or 1 to activate or deactivate the current control transistor, and
a channel width of the amplifying transistor satisfies $$wi = W0 \times R^i - W0 \times R^{(i-1)},$$

where R is a constant which satisfies $$R = (Wk/W0)^{1/k},$$

where wi is a channel width of the amplifying transistor of the unit circuit which corresponds to the switch control signal of an ordinal number i (0, 1, 2, . . . , k; where k is an integer of not less than 0), and Wi is a channel width of i numbers of amplifying transistors whose gain is obtained when i is increased step-wise from 0 by the increment of 1 to increase the number of activated unit circuits according to the operation control voltage which was selected according to the switch control signal to activate the unit circuits.

35. The variable gain amplifier as set forth in claim 18, wherein the operation control voltages are voltages of two levels: one cutting a current flow into the unit circuits; and the other allowing a current flow into the unit circuits.

36. The variable gain amplifier as set forth in claim 35, wherein the amplifying transistor comprises an amplifying transistor differential pair.

37. The variable gain amplifier as set forth in claim 36, further comprising:
a first transistor differential pair and a second transistor differential pair, each being provided as the amplifying transistor differential pair, with differential outputs which are cross-connected to each other between the first transistor differential pair and the second transistor differential pair, the first transistor differential pair and the second transistor differential pair being connected to a source via different sides of the differential outputs; and
a load impedance which connects outputs of the first and second transistor differential pairs to a power source,
wherein gates of transistors which make up the first transistor differential pair and the second transistor differential pair receive oscillation signals which are 180° out of phase from each other.

38. The variable gain amplifier as set forth in claim 36, further comprising:
a first transistor differential pair and a second transistor differential pair, each being provided as the amplifying transistor differential pair, with differential outputs which are cross-connected to each other between the first transistor differential pair and the second transistor differential pair, the first transistor differential pair and the second transistor differential pair being connected to a source via different sides of the differential outputs;
a third transistor differential pair and a fourth transistor differential pair, each being provided as the amplifying transistor differential pair, with differential outputs which are cross-connected to each other between the third transistor differential pair and the fourth transistor differential pair, the third transistor differential pair and the fourth transistor differential pair being connected to a source via different sides of the differential outputs; and
a load impedance which connects outputs of the first through fourth transistor differential pairs to a power source,
wherein differential inputs of the first and second transistor differential pairs receive first oscillation signals which are 180° out of phase from each other, and differential inputs of the third and fourth transistor differential pairs receive a second oscillation signal which is 90° out of phase from the first oscillation signals.

39. The variable gain amplifier as set forth in claim 35, wherein respective outputs of the unit circuits are connected to a power source via a load impedance.

40. The variable gain amplifier as set forth in claim 35, further comprising:
a transistor differential pair with a source which is connected to respective outputs of the unit circuits; and
a load impedance which connects outputs of the transistor differential pair to a power source,
wherein gates of transistors which make up the transistor differential pair receive oscillation signals which are 180° out of phase from each other.

41. The variable gain amplifier as set forth in claim 35, comprising:
a variable impedance current mirror circuit, in replacement of the current path control section, which is made up of a plurality of unit current mirror circuits which are disposed parallel to one another and connected to one another through current inputs and current outputs of the unit current mirror circuits, each of the unit current mirror circuits including a first transistor, a second transistor which is paired with the first transistor to make up a current mirror, and a switch circuit which switches levels of operation control voltages for the first and second transistors.

42. The variable gain amplifier as set forth in claim 35, further comprising:
a current source which supplies a constant current to the current control transistor of each unit circuit.

43. The variable gain amplifier as set forth in claim 35, wherein the voltage generator varies the level of one of the operation control voltages according to the number of unit circuits with no current supply, so as to control a total amount of a current flow through the remaining unit circuits.

44. The variable gain amplifier as set forth in claim 43, wherein the voltage generator generates the operation control voltages so as to control and maintain the total amount of a current flow at a constant level.

45. The variable gain amplifier as set forth in claim 1, wherein the current path control section varies the percentage of the amplifying transistor, and controls and maintains a current flow through the amplifying transistor at a constant level.

46. The variable gain amplifier as set forth in claim 45, wherein:
the current path control section includes a current control transistor which controls a current flow through the amplifying transistor,
said variable gain amplifier comprising:
a plurality of unit circuits which are disposed parallel to one another and connected to one another through signal inputs and signal outputs of the unit circuits, each of the unit circuits including the amplifying transistor, the current control transistor, an auxiliary current control transistor which makes up a current mirror with the current control transistor, and a switch control circuit which switches levels of operation control voltages for the current control transistor and the auxiliary current control transistor; and
a current source which supplies a constant current to the auxiliary current control transistor.

47. The variable gain amplifier as set forth in claim 46, wherein the amplifying transistor comprises an amplifying transistor differential pair.

48. The variable gain amplifier as set forth in claim 47, further comprising:
a first transistor differential pair and a second transistor differential pair, each being provided as the amplifying transistor differential pair, with differential outputs which are cross-connected to each other between the first transistor differential pair and the second transistor differential pair, the first transistor differential pair and the second transistor differential pair being connected to a source via different sides of the differential outputs; and
a load impedance which connects outputs of the first and second transistor differential pairs to a power source,
wherein gates of transistors which make up the first transistor differential pair and the second transistor differential pair receive oscillation signals which are 180° out of phase from each other.

49. The variable gain amplifier as set forth in claim 47, further comprising:
a first transistor differential pair and a second transistor differential pair, each being provided as the amplifying transistor differential pair, with differential outputs which are cross-connected to each other between the first transistor differential pair and the second transistor differential pair, the first transistor differential pair and the second transistor differential pair being connected to a source via different sides of the differential outputs;
a third transistor differential pair and a fourth transistor differential pair, each being provided as the amplifying transistor differential pair, with differential outputs which are cross-connected to each other between the third transistor differential pair and the fourth transistor differential pair, the third transistor differential pair and the fourth transistor differential pair being connected to a source via different sides of the differential outputs; and
a load impedance which connects outputs of the first through fourth transistor differential pairs to a power source,
wherein differential inputs of the first and second transistor differential pairs receive first oscillation signals which are 180° out of phase from each other, and differential inputs of the third and fourth transistor differential pairs receive a second oscillation signal which is 90° out of phase from the first oscillation signals.

50. The variable gain amplifier as set forth in claim 46, wherein respective outputs of the unit circuits are connected to a power source via a load impedance.

51. The variable gain amplifier as set forth in claim 46, further comprising:
a transistor differential pair with a source which is connected to respective outputs of the unit circuits; and
a load impedance which connects outputs of the transistor differential pair to a power source,
wherein gates of transistors which make up the transistor differential pair receive oscillation signals which are 180° out of phase from each other.

52. The variable gain amplifier as set forth in claim 46, comprising:
a variable impedance current mirror circuit, in replacement of the current path control section, which is made up of a plurality of unit current mirror circuits which are disposed parallel to one another and connected to one another through current inputs and current outputs of the unit current mirror circuits, each of the unit current mirror circuits including a first transistor, a second transistor which is paired with the first transistor to make up a current mirror, and a switch circuit which switches levels of operation control voltages for the first and second transistors.

53. The variable gain amplifier as set forth in claim 47, further comprising:
a current source which supplies a constant current to the current control transistor of each unit circuit.

54. The variable gain amplifier as set forth in claim 47, wherein:
the switch control signal takes a value of either 0 or 1 to activate or deactivate the current control transistor, and
a channel width of the amplifying transistor satisfies $$wi = W0 \times R^i - W0 \times R^{(i-1)},$$

where R is a constant which satisfies $$R = (Wk/W0)^{1/k},$$

where wi is a channel width of the amplifying transistor of the unit circuit which corresponds to the switch control signal of an ordinal number i (0, 1, 2, . . . , k; where k is an integer of not less than 0), and Wi is a channel width of i numbers of amplifying transistors whose gain is obtained when i is increased step-wise from 0 by the increment of 1 to increase the number of activated unit circuits according to the operation control voltage which was selected according to the switch control signal to activate the unit circuits.

* * * * *